(12) United States Patent
Tustaniwskyj et al.

(10) Patent No.: US 11,774,486 B2
(45) Date of Patent: Oct. 3, 2023

(54) TEMPERATURE CONTROL SYSTEM INCLUDING CONTACTOR ASSEMBLY

(71) Applicant: Delta Design, Inc., Poway, CA (US)

(72) Inventors: Jerry Ihor Tustaniwskyj, Mission Viejo, CA (US); Steve Wetzel, Poway, CA (US)

(73) Assignee: DELTA DESIGN INC., Poway, CA (US)

( * ) Notice: Subject to any disclaimer, the term of this patent is extended or adjusted under 35 U.S.C. 154(b) by 0 days.

(21) Appl. No.: 17/853,832

(22) Filed: Jun. 29, 2022

(65) Prior Publication Data

US 2023/0003786 A1 Jan. 5, 2023

Related U.S. Application Data

(60) Provisional application No. 63/217,035, filed on Jun. 30, 2021.

(51) Int. Cl.
*G01R 31/02* (2006.01)
*G01R 31/26* (2020.01)
(Continued)

(52) U.S. Cl.
CPC ..... *G01R 31/2642* (2013.01); *G01R 31/2831* (2013.01); *G01R 31/2884* (2013.01);
(Continued)

(58) Field of Classification Search
CPC ............ G01R 31/2642; G01R 31/2891; G01R 31/2877; G01R 31/2875; G01R 31/2884;
(Continued)

(56) References Cited

U.S. PATENT DOCUMENTS 4,739,258 A 4/1988 Schwarz
5,164,661 A 11/1992 Jones
(Continued)

FOREIGN PATENT DOCUMENTS

EP 1 198 001 A2 4/2002
JP 2003-506686 A 2/2003
(Continued)

OTHER PUBLICATIONS

Foreign Action other than Search Report on JP 2019-536840 dated Aug. 10, 2021.
(Continued)

*Primary Examiner* — Raul J Rios Russo
(74) *Attorney, Agent, or Firm* — FOLEY & LARDNER LLP

(57) ABSTRACT

A method for controlling temperature in a temperature control system. The method includes providing a temperature control system including a controller, a first contactor assembly having a first channel system, a plurality of first contacts, each of the first contacts including a portion that is disposed within the first channel system, and one or more of a first exhaust valve or a first inlet valve, and a second contactor assembly having a second channel system, a plurality of second contacts, each of the second contacts including a portion that is disposed within the second channel system, and one or more of a second exhaust valve or a second inlet valve. The method also includes receiving, by the first contactor assembly, a fluid at a first temperature. The method also includes receiving, by the second contactor assembly, the fluid at the first temperature.

22 Claims, 9 Drawing Sheets

(51) Int. Cl.
*H01L 23/46* (2006.01)
*G01R 31/28* (2006.01)
*H01L 21/66* (2006.01)

(52) U.S. Cl.
CPC ..... *G01R 31/2886* (2013.01); *G01R 31/2891* (2013.01); *H01L 23/46* (2013.01); *H01L 22/34* (2013.01); *H01L 2924/00* (2013.01); *H01L 2924/0002* (2013.01)

(58) Field of Classification Search
CPC . G01R 31/2886; G01R 31/2831; H01L 23/46; H01L 2924/00; H01L 2924/0002; H01L 22/34
USPC ......... 324/71, 378, 403, 415, 425, 500, 537, 324/762.01
See application file for complete search history.

(56) References Cited

U.S. PATENT DOCUMENTS

| | | | |
|---|---|---|---|
| 5,482,793 A | 1/1996 | Burns et al. | |
| 5,911,897 A | 6/1999 | Hamilton | |
| 5,990,550 A | 11/1999 | Umezawa | |
| 6,184,504 B1 | 2/2001 | Cardella | |
| 6,362,640 B1 | 3/2002 | Wee | |
| 6,781,218 B1 | 8/2004 | Wilsher | |
| 7,196,566 B2 | 3/2007 | Kaiser, Jr. | |
| 7,474,089 B2 | 1/2009 | Gibbs et al. | |
| 7,560,714 B2 | 7/2009 | Kristiansson et al. | |
| 7,695,286 B2 | 4/2010 | Swart et al. | |
| 7,862,391 B2 | 1/2011 | Johnston et al. | |
| 8,105,119 B2 | 1/2012 | Swart et al. | |
| 8,471,575 B2 | 6/2013 | Fregeau et al. | |
| 8,648,616 B2 | 2/2014 | St. Onge et al. | |
| 8,907,694 B2 | 12/2014 | Swart et al. | |
| 8,928,344 B2 | 1/2015 | Rathburn | |
| 9,152,747 B2 | 10/2015 | Liggiero | |
| 9,213,616 B2 | 12/2015 | Fritzsche et al. | |
| 9,297,830 B2 | 3/2016 | McCarthy et al. | |
| 9,336,108 B2 | 5/2016 | Fritzsche et al. | |
| 9,430,348 B2 | 8/2016 | Fritzsche et al. | |
| 9,430,349 B2 | 8/2016 | Fritzsche et al. | |
| 9,459,978 B2 | 10/2016 | Fritzsche et al. | |
| 9,554,486 B2 | 1/2017 | Pikovsky | |
| 2002/0075024 A1 | 6/2002 | Fredeman et al. | |
| 2002/0186031 A1 | 12/2002 | Pelissier | |
| 2004/0066207 A1 | 4/2004 | Bottoms et al. | |
| 2004/0077200 A1 | 4/2004 | Ishikawa et al. | |
| 2004/0123963 A1 | 7/2004 | Chen et al. | |
| 2004/0123968 A1 | 7/2004 | Osanai et al. | |
| 2005/0026476 A1 | 2/2005 | Mok et al. | |
| 2005/0152663 A1 | 7/2005 | Bench et al. | |
| 2006/0119377 A1 | 6/2006 | Chong et al. | |
| 2006/0173269 A1 | 8/2006 | Glossop | |
| 2006/0245122 A1 | 11/2006 | Drawe | |
| 2006/0290370 A1 | 12/2006 | Lopez | |
| 2007/0001692 A1 | 1/2007 | Yamada | |
| 2009/0002010 A1 | 1/2009 | Wong et al. | |
| 2009/0153171 A1 | 6/2009 | Lee et al. | |
| 2009/0197436 A1 | 8/2009 | Trobough | |
| 2010/0007367 A1 | 1/2010 | Spielberger et al. | |
| 2010/0039133 A1 | 2/2010 | McFarland et al. | |
| 2010/0066399 A1 | 3/2010 | Kabbani | |
| 2011/0136374 A1 | 6/2011 | Mostoller et al. | |
| 2011/0148434 A1 | 6/2011 | Max | |
| 2012/0074975 A1 | 3/2012 | Detofsky et al. | |
| 2012/0139093 A1 | 6/2012 | Start et al. | |
| 2012/0155022 A1 | 6/2012 | Alcala et al. | |
| 2013/0294041 A1 | 11/2013 | Syal | |
| 2013/0300521 A1 | 11/2013 | Khine et al. | |
| 2015/0268295 A1* | 9/2015 | Sasaki ................ G01R 31/2875 324/750.08 |
| 2016/0041220 A1 | 2/2016 | Leutschacher et al. | |
| 2016/0118317 A1 | 4/2016 | Shedd et al. | |
| 2017/0030964 A1* | 2/2017 | Barabi .................. F16K 17/003 |
| 2017/0211854 A1 | 7/2017 | Crocco | |
| 2017/0227599 A1* | 8/2017 | Wu ..................... G01R 31/2875 |
| 2018/0284156 A1 | 10/2018 | Alvarez Gonzalez et al. | |
| 2022/0334175 A1* | 10/2022 | Konishi .................... F28F 3/12 |
| 2023/0119110 A1* | 4/2023 | Konishi ............. G01R 31/2875 324/750.08 |

FOREIGN PATENT DOCUMENTS

| | | |
|---|---|---|
| JP | 2005-533254 A | 11/2005 |
| JP | 2006-078478 A | 3/2006 |
| JP | 2008-537637 A | 9/2008 |
| JP | 2010-021530 A | 1/2010 |
| JP | 5161870 | 12/2012 |
| JP | 2013-234912 | 11/2013 |
| KR | 1020010024445 A | 3/2001 |
| KR | 100366747 B1 | 1/2003 |
| KR | 1020050014885 A | 2/2005 |
| KR | 1020070027524 A | 3/2007 |
| WO | WO-2012/159003 A1 | 11/2012 |
| WO | WO-2012/170402 A1 | 12/2012 |
| WO | WO-2013/155348 A1 | 10/2013 |
| WO | WO-2015/081081 A1 | 4/2015 |
| WO | WO-2021/160537 A1 | 8/2021 |

OTHER PUBLICATIONS

Fuji Ceramics Corporation, Biomorph type vibrators, http://www.fujicera.co.jp/en/product/bimorph/, 6 pages, accessed Jun. 16, 2021.
International Preliminary Report on Patentability and Written Opinion PCT Appl. Ser. No. PCT/US2018/012763 dated Jul. 9, 2019 (10 pages).
International Search Report and Written Opinion dated Jul. 25, 2018 in related Int'l Appl. PCT/US2018/012763 (19 pgs.).
Japanese Decision of Refusal on JP Appl. Ser. No. 2019-536840 dated May 17, 2022 (11 pages).
PI-USA, P-286, P-288, P-289, Bimorph Piezo Disk Translators with Long Travel Range, https://www.pi-usa.us/en/products/piezo-actuators-stacks-benders-tubes/pztactuators-1-28/, 7 pages, accessed Jun. 16, 2021.
PI-USA, PL-122 . . . PL-140 Bimorph Piezoelectric Multilayer Bender Actuator, https://www.pi-usa.us/en/products/piezo-actuators-stacks-benders-tubes/pztactuators-1-30a/, 6 pages, accessed Jun. 16, 2021.
Roberts, J. et al. "Characterization of Microprocessor Chip Stress Distributions During Component Packaging and Thermal Cycling." IEEE Proceedings, Electronic Components and Technology Conference, 2010, pp. 1281-1295.
Substantive Examination on PI2019003844 dated Feb. 21, 2023.

* cited by examiner

TEMPERATURE CONTROL SYSTEM INCLUDING CONTACTOR ASSEMBLY

CROSS-REFERENCE TO RELATED PATENT APPLICATION

This present application claims the benefit of U.S. Provisional Patent Application 63/217,035, filed Jun. 30, 2021, the entire disclosure of which is hereby incorporated by reference herein.

BACKGROUND

The present disclosure relates generally to the field of electrical testing equipment for testing devices, such as semiconductors.

Testing these types of devices is often done at a particular temperature. However, it can be difficult to desirably control the temperature of the devices during testing. For example, variations of a few degrees Celsius during testing can make results inaccurate in some instances.

Devices may produce heat during testing. This heat may be referred to as 'self-heat.' The devices may be provided with a thin heater which is turned on to heat the devices. However, when the devices begin producing heat, the thin heater may be turned down or off. For example, as the device produces an increasing amount of heat, the thin heater may be gradually turned off. To test the devices at a particular temperature, air with liquid nitrogen and/or compressed dry air may be provided to the devices. By controlling flow of the air, such as by manually opening and closing air pathways, it may be possible to change a flow of the air provided to the devices.

SUMMARY

One embodiment relates to a method for controlling temperature in a temperature control system. The method includes providing a temperature control system including a controller, a first contactor assembly having a first channel system, a plurality of first contacts, each of the first contacts including a portion that is disposed within the first channel system, and one or more of a first exhaust valve or a first inlet valve, and a second contactor assembly having a second channel system, a plurality of second contacts, each of the second contacts including a portion that is disposed within the second channel system, and one or more of a second exhaust valve or a second inlet valve. The method also includes receiving, by the first contactor assembly, a fluid at a first temperature. The method also includes receiving, by the second contactor assembly, the fluid at the first temperature. The method also includes determining, by the controller, a temperature of the first contacts within the first channel system. The method also includes comparing, by the controller, the temperature of the first contacts to a setpoint temperature. The method also includes causing, by the controller, the one or more of the first exhaust valve or the first inlet valve to be repositioned based on the comparison of the temperature of the first contacts to the setpoint temperature.

Another embodiment relates to a temperature control system. The temperature control system includes a testing device, a contactor assembly, and a controller. The testing device includes a plurality of contactor receiving locations. The contactor assembly is positioned within one of the contactor receiving locations. The contactor assembly includes a channel system, a plurality of contacts, a sensor, a first port, and at least one of a first exhaust valve or an inlet valve. The channel system is configured to receive a fluid. Each of the contacts includes a portion that is disposed within the channel system. The sensor is configured to provide a signal. The first port is configured to provide the fluid from the contactor assembly. The first exhaust valve is in fluid communication with the first port. The first exhaust valve is operable between an open position and a closed position. The first exhaust valve facilitates flow from the contactor assembly in the open position and inhibits flow from the contactor assembly in the closed position. The inlet valve is operable between an open position and a closed position. The inlet valve facilitates flow to the sensor in the open position and inhibits flow to the sensor in the closed position. The controller is configured to receive a setpoint temperature associated with testing of a target device. The controller is also configured to determine a temperature of the contacts based on the signal. The controller is also configured to compare the temperature to the setpoint temperature. The controller is also configured to reposition the at least one of the first exhaust valve or the inlet valve, towards one of the open position or the closed position based on the comparison between the temperature and the setpoint temperature.

As described in more detail herein, the temperature control system is configured to be controlled so as to cause contacts of one or more contactor assemblies to be heated or cooled by controlling flow of fluid through one or more of the contactor assemblies. For example, flow of fluid through a first contactor assembly may be based on a temperature of contacts of a second contactor assembly and/or a temperature of contacts of the first contactor assembly. As a result, throughput of the temperature control system may be greater than other systems which do not control flow in these ways.

BRIEF DESCRIPTION OF THE DRAWINGS

The details of one or more implementations are set forth in the accompanying Figures and the description below. Other features, aspects, and advantages of the disclosure will become apparent from the description, the Figures, and the claims, in which:

It will be recognized that some or all of the Figures are schematic representations for purposes of illustration. The Figures are provided for the purpose of illustrating one or more implementations with the explicit understanding that they will not be used to limit the scope or the meaning of the claims.

DETAILED DESCRIPTION

Following below are more detailed descriptions of various concepts related to, and implementations of, methods, apparatuses, and systems for providing a temperature control system that includes a contactor assembly. The various concepts introduced above and discussed in detail below may be implemented in any of numerous ways, as the described concepts are not limited to any particular manner of implementation. Examples of specific implementations and applications are provided primarily for illustrative purposes.

In order to test a device at a setpoint temperature, it may be desirable to control the flow of a fluid that is used to heat or cool contacts attached to a device. This may be done by using one or more valves. The valves may be located on a contactor. The valves may control the flow of a fluid through the contactor. Various devices may be used to control the flow of the fluid through a contactor so that the contacts may be maintained at the setpoint temperature.

Implementations discussed herein are directed to a temperature control system that includes contactor assemblies, each of which includes at least one of an inlet valve or one or more exhaust valves. The inlet valve and the exhaust valves can be repositioned by a controller to control flow of fluid past the contacts, and therefore the heat provided to the contacts by the fluid. A sensor is used to facilitate determination of a temperature of the contacts. The controller may, for example, utilize the temperature of the fluid proximate the sensor in a first contactor assembly to control valves of a second contactor assemblies. The controller may also, for example, account for the temperature of the contacts sensed by a sensor in the second contactor assembly when controlling the at least one of the inlet valve or the one or more exhaust valves of the second contactor assemblies. Various processes for controlling the valves of the various contactor assemblies are discussed herein.

Figure 1:
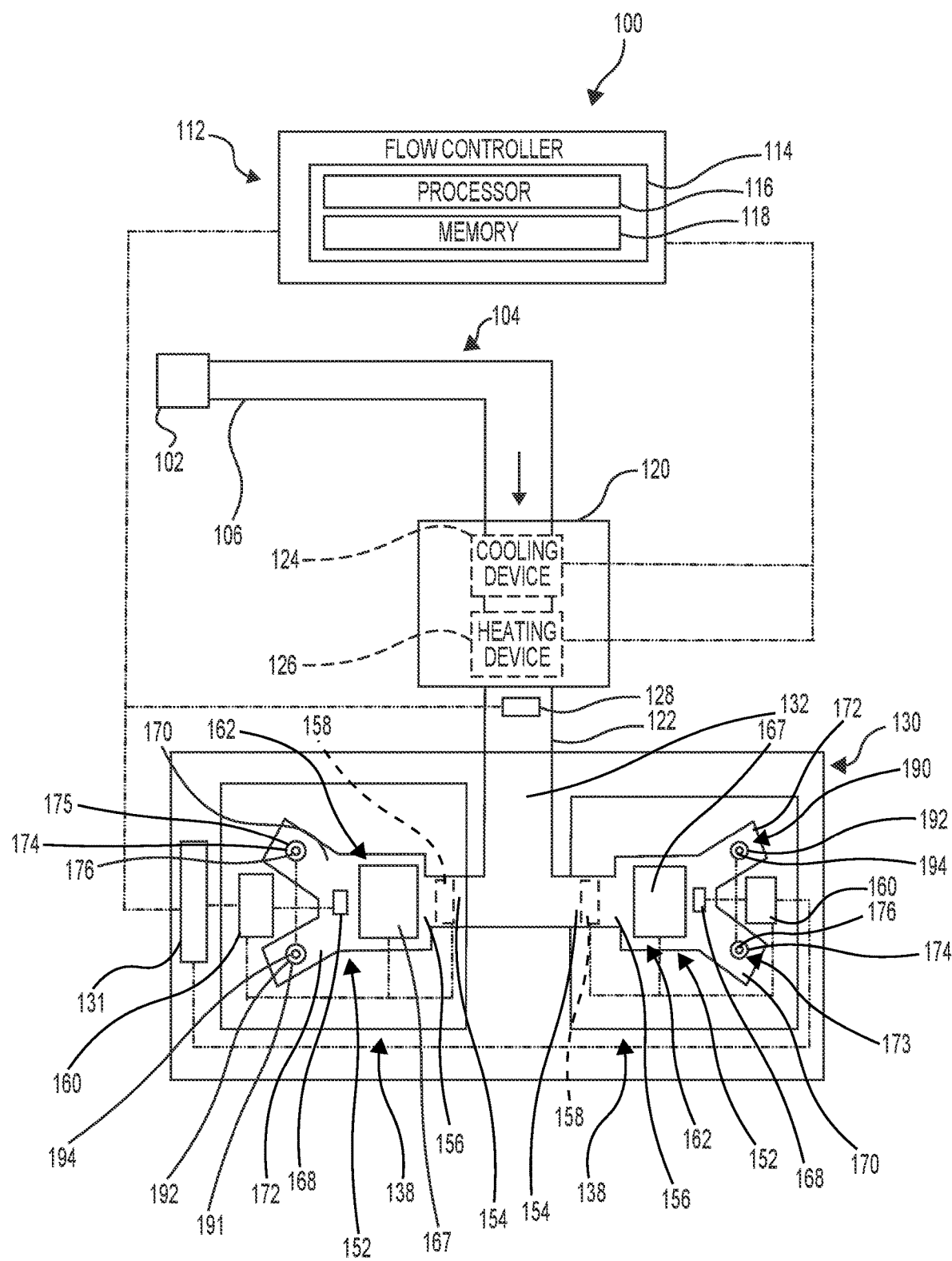
FIG. 1 illustrates a temperature control system for controlling fluid flow and fluid temperature to a target device, according to an embodiment.
Figure 2:
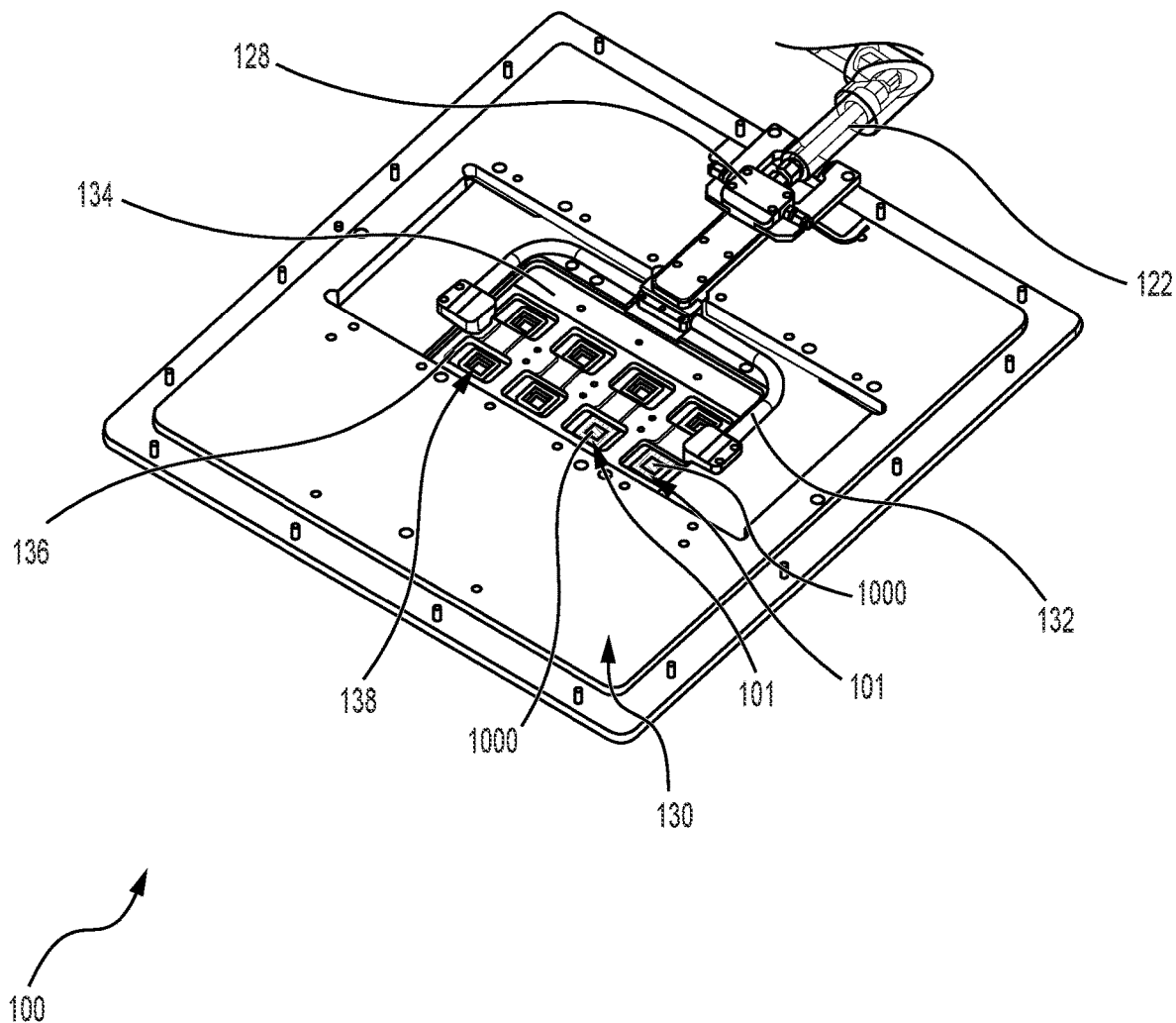
FIG. 2 illustrates a perspective view of a portion of the temperature control system shown in FIG. 1, according to an embodiment.

FIG. 1 illustrates a temperature control system 100 (e.g., testing system, etc.). As explained in more detain herein, the temperature control system 100 is configured to supply a fluid (e.g., air, dry air, compressed air, ambient air, etc.) to a contactor assembly to control a temperature (e.g., socket-side temperature, etc.) of one or more sets of contacts, where each set of contacts provides signals to a target device 101 (e.g., socket, device under testing (DUT), tested device, semiconductor, electrical device, etc.), as shown in FIG. 2. In general, when a target device 101 is attached to a contactor array for testing using the contactor array, power consumed by the target device 101 during testing is dissipated as heat, thereby causing the temperature of the contacts to fluctuate. However, testing of some target devices 101 requires careful control over the temperature of the contacts, and it is desirable to avoid undesirable fluctuations. The temperature control system 100 described herein provides a fluid to a contactor assembly which tests a target device 101 and uses the fluid to control a temperature of the contacts so as to mitigate undesirable fluctuations of the temperature of the contacts. The temperature control system 100 may additionally assist in facilitating thermal contact on a top side of each of the target devices 101.

The temperature control system 100 includes a fluid source 102 (e.g., compressed air source, fan, air intake, evaporated nitrogen source, etc.). The fluid source 102 is configured to contain the fluid. In some applications, such as those where testing of the target devices 101 at relatively cold temperatures is desired, the fluid source 102 is an evaporated nitrogen source. The temperature control system 100 also includes a plumbing system 104 (e.g., conduit system, line system, etc.). The plumbing system 104 is configured to receive the fluid from the fluid source 102 and transport the fluid throughout the temperature control system 100.

The plumbing system 104 includes a first conduit 106 (e.g., pipe, line, etc.). The first conduit 106 is configured to receive the fluid from the fluid source 102. In some embodiments, the pressure of the fluid allows for the fluid to transport from the fluid source 102 to the first conduit 106. In some embodiments, the temperature control system 100 may also include a fluid pump (e.g., air pump, fan, rotary pump, positive displacement pump etc.).

The temperature control system 100 includes a temperature controller 112 (e.g., control circuit, driver, etc.). As is described in more detail herein, the temperature controller 112 is configured to control various portions of the temperature control system 100. The temperature controller 112 is configured to electrically transmit information (e.g., commands, temperature readings, target temperature values, setpoint temperatures, etc.) to, and electrically receive information from, various portions of the temperature control system 100.

The temperature controller 112 includes a processing circuit 114. The processing circuit 114 includes a processor 116 and a memory 118. The processor 116 may include a microprocessor, an application-specific integrated circuit (ASIC), a field-programmable gate array (FPGA), etc., or combinations thereof. The memory 118 may include, but is not limited to, electronic, optical, magnetic, or any other storage or transmission device capable of providing a processor, ASIC, FPGA, etc. with program instructions. This memory 118 may include a memory chip, Electrically Erasable Programmable Read-Only Memory (EEPROM), Erasable Programmable Read Only Memory (EPROM), flash memory, or any other suitable memory from which the temperature controller 112 can read instructions. The instructions may include code from any suitable programming language. The memory 118 may include various modules that include instructions, which are configured to be implemented by the processor 116.

The temperature control system 100 includes a heat exchanger 120 (e.g., temperature controller, etc.). The heat exchanger 120 is fluidly coupled to the fluid source 102 via the first conduit 106 and is configured to receive the fluid from the first conduit 106. The heat exchanger 120 is electrically connected to the temperature controller 112 and configured to alter (e.g., increase, decrease) the temperature of the fluid received from the fluid source 102 prior to the fluid being provided to downstream portions of the temperature control system 100. The plumbing system 104 also includes a second conduit 122. The second conduit 122 receives the fluid from the heat exchanger 120 (e.g., after the temperature of the fluid has been altered by the heat exchanger 120, etc.).

In operation, the processor 116 provides the heat exchanger 120 with a setpoint temperature (e.g., desired temperature, target temperature value etc.), and the heat exchanger 120 is operated to cause the temperature of the fluid to attain the setpoint temperature. In operation, the heat exchanger 120 is operable to heat or cool the fluid. The setpoint temperature may be received by the temperature controller 112 from a user (e.g., operator, etc.) and stored in the memory 118. In some embodiments, the setpoint temperature is a preset value stored on the memory 118 for various target devices 101. In some embodiments, the setpoint temperature accounts for heat provided by an ambient environment within which the temperature control system 100 is located. For example, where the ambient environment provides heating sufficient to raise a temperature of the target device 101 by 10 Kelvin (K) and it is desired to cause the temperature of the fluid to be 400 K, the setpoint temperature may be 390 K.

In various embodiments, the heat exchanger 120 includes a cooling device 124 (e.g., liquid nitrogen supply, coiling coil, fan, Peltier cell, etc.). The cooling device 124 is electrically connected to the temperature controller 112 and is configured to cool the fluid received from the first conduit 106 prior to the fluid being provided to the second conduit 122. In some embodiments, the cooling device 124 is a liquid nitrogen supply which facilitates cooling of the fluid (e.g., by causing evaporation of nitrogen through the mixing of liquid nitrogen and air, etc.). In some applications, the cooling device 124 includes a liquid to gas heat exchanger or another similar device capable of cooling the fluid.

In these embodiments, the setpoint temperature may be between approximately equal to (e.g., within 5% of, etc.) between 233 K and 206 K (e.g., 244 K, 240 K, 236 K, 233 K, 228 K, 226 K, 222 K, 218 K, 214 K, 210 K, 206 K, 208 K, 197 K etc.). Of course, a temperature of the fluid within the heat exchanger 120 is different from a temperature of the fluid downstream of the heat exchanger 120, such as at the contactor assemblies. In some applications, the heat exchanger 120 is separated from the contactor assemblies by a substantial distance, and the temperature of the fluid within the heat exchanger 120 is substantially different from the temperature of the fluid at the contactor assemblies.

In various embodiments, the heat exchanger 120 also includes a heating device 126 (e.g., heater, heat pump, thermoelectric heater, resistance heater, etc.). The heating device 126 is electrically connected to the temperature controller 112 and is configured to heat the fluid received from the first conduit 106 prior to the fluid being provided to the second conduit 122. In these embodiments, the setpoint temperature may be approximately equal to between 363 K and 473 K (e.g., 345 K, 363 K, 368 K, 373 K, 378 K, 383 K, 388 K, 393 K, 398 K, 403 K, 408 K, 413 K, 418 K, 423 K, 428 K, 433 K, 438 K, 443 K, 448 K, 453 K, 458 K, 463 K, 468 K, 473 K, 496 K, etc.).

Various different setpoint temperatures may be used depending on the application. For example, the setpoint temperature may be between 206 K and 473 K. The temperature controller 112 may variously control the cooling device 124 and the heating device 126 based on the setpoint temperature.

In various embodiments, the cooling device 124 and the heating device 126 may be configured to maintain the temperature of the fluid as the fluid is received from the first conduit 106. The cooling device 124 may be configured to cool the fluid and the heating device 126 may be configured to heat the fluid simultaneously. In these embodiments, the setpoint temperature may be approximately equal to between 288 K and 298 K (e.g., 273 K, 288 K, 293 K, 298 K, 312 K, etc.).

In various embodiments, the temperature control system 100 includes a conduit sensor 128 (e.g., temperature sensor, resistance temperature device (RTD), pressure sensor, etc.). The conduit sensor 128 is disposed within the plumbing system 104. For example, the conduit sensor 128 may be disposed within the second conduit 122, as shown in FIG. 1. As is explained in more detail herein, the conduit sensor 128 is used to control the heat exchanger 120.

The conduit sensor 128 is electrically connected to the temperature controller 112 and configured to facilitate measurement of a property (e.g., temperature, pressure, etc.) of the fluid being transported from the heat exchanger 120 through the second conduit 122 by providing a signal to the processor 116. The processor 116 receives the signal and determines a reading of the property (e.g., a temperature of the fluid, a pressure of the fluid, etc.). The processor 116 may store the reading in the memory 118.

In some embodiments, the processor 116 may adjust the setpoint temperature based on the reading. For example, if the reading is above the setpoint temperature, the processor 116 may decrease the heat to be provided from the heat exchanger 120 to the fluid. In another example where the setpoint temperature is relatively low, the processor 116 may determine that the reading is greater than the setpoint temperature and operate the cooling device 124 to increase cooling provided to the fluid within the heat exchanger 120. In another example where the setpoint temperature is relatively high, the processor 116 may determine that the reading is less than the setpoint temperature and operate the heating device 126 to increase heating provided to the fluid within the heat exchanger 120.

As shown in FIGS. 1 and 2, the temperature control system 100 also includes a testing device 130 (e.g., socket array, testing bench, semiconductor testing device, test handler, etc.). As is explained in more detail herein, the testing device 130 is configured to facilitate testing of multiple of the target devices 101. The testing device 130 may facilitate testing of any number (e.g., 2, 3, 4, 5, 6, 7, 8, 9, 10, 11, 12, 13, 14, 15, 16, 24, 30, 32, etc.) of the target devices 101. In this way, the testing device 130 enables testing of an individual target device 101 to be more economical and desirable.

The testing device 130 receives the fluid from the second conduit 122 (e.g., after the temperature of the fluid has been increased by the heat exchanger 120, after the temperature of the fluid has been decreased by the heat exchanger 120, etc.) and is configured to facilitate testing (e.g., performance testing, etc.) of the target devices 101. The testing device 130 includes a testing device terminal 131 (e.g., connection, port, etc.). As is explained in more detail herein, the testing device terminal 131 enables the testing device 130 to receive signals from the temperature controller 112. The testing device terminal 131 is electrically connected to the temperature controller 112.

The testing device 130 includes a manifold 132 (e.g., conduit, line, pipe, etc.). The manifold 132 is configured to receive the fluid from the second conduit 122. The manifold 132 facilitates distribution of the fluid to the contactor assemblies that each facilitate testing of one of the target devices 101.

The testing device 130 includes at least one contactor receiving location 136 (e.g., port, socket array etc.). Each of the contactor receiving locations 136 facilitates testing of one of the target devices 101. In some embodiments, the testing device 130 includes a plurality (e.g., 2, 3, 4, 5, 6, 7, 8, 9, 10, 11, 12, 13, 14, 15, 16, 24, 30, 32, etc.) of the contactor receiving locations 136.

Figure 5:
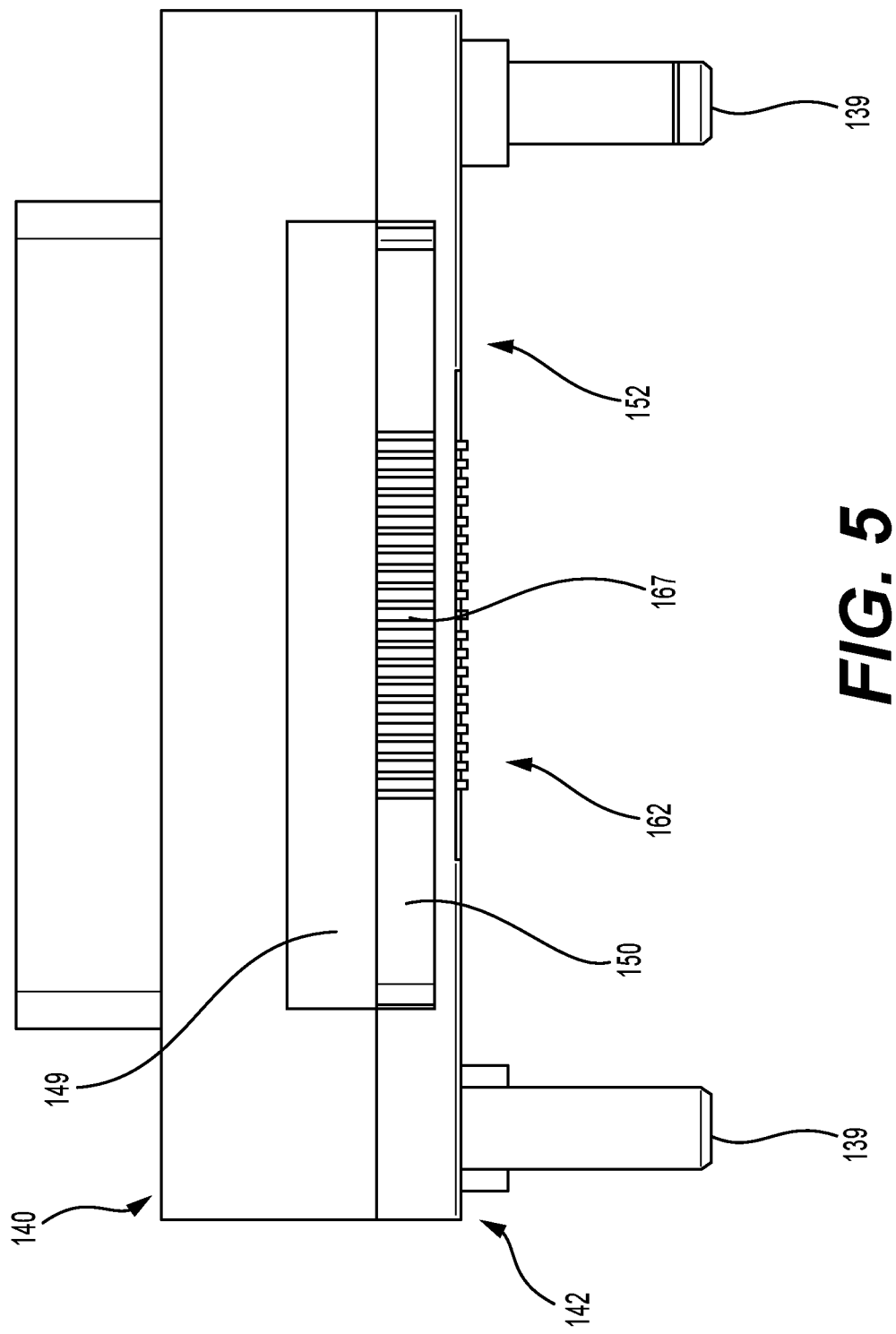
FIG. 5 illustrates a front view of the contactor assembly shown in FIG. 3.

The temperature control system 100 also includes a contactor assembly 138 (e.g., interfacing device, etc.). As is described in more detail herein, the contactor assembly 138 is configured to facilitate testing of one of the target devices 101. The contactor assembly 138 includes at least one mounting peg 139 (e.g., post, projection, etc.). The mounting pegs 139, as shown in FIG. 5, are each configured to facilitate removable coupling of the contactor assembly 138 to one of the contactor receiving locations 136. In some embodiments, the mounting peg 139 is configured to electrically connect the contactor assembly 138 to the testing device terminal 131 via the at least once contactor receiving location 136.

As shown in FIG. 1, the temperature control system 100 includes two contactor assemblies 138. Each contactor assembly 138 may be similarly configured. However, the temperature control system 100 may include one, two, three, four, six, eight, ten, sixteen, thirty-two or other numbers of the contactor assemblies 138.

Figure 3:
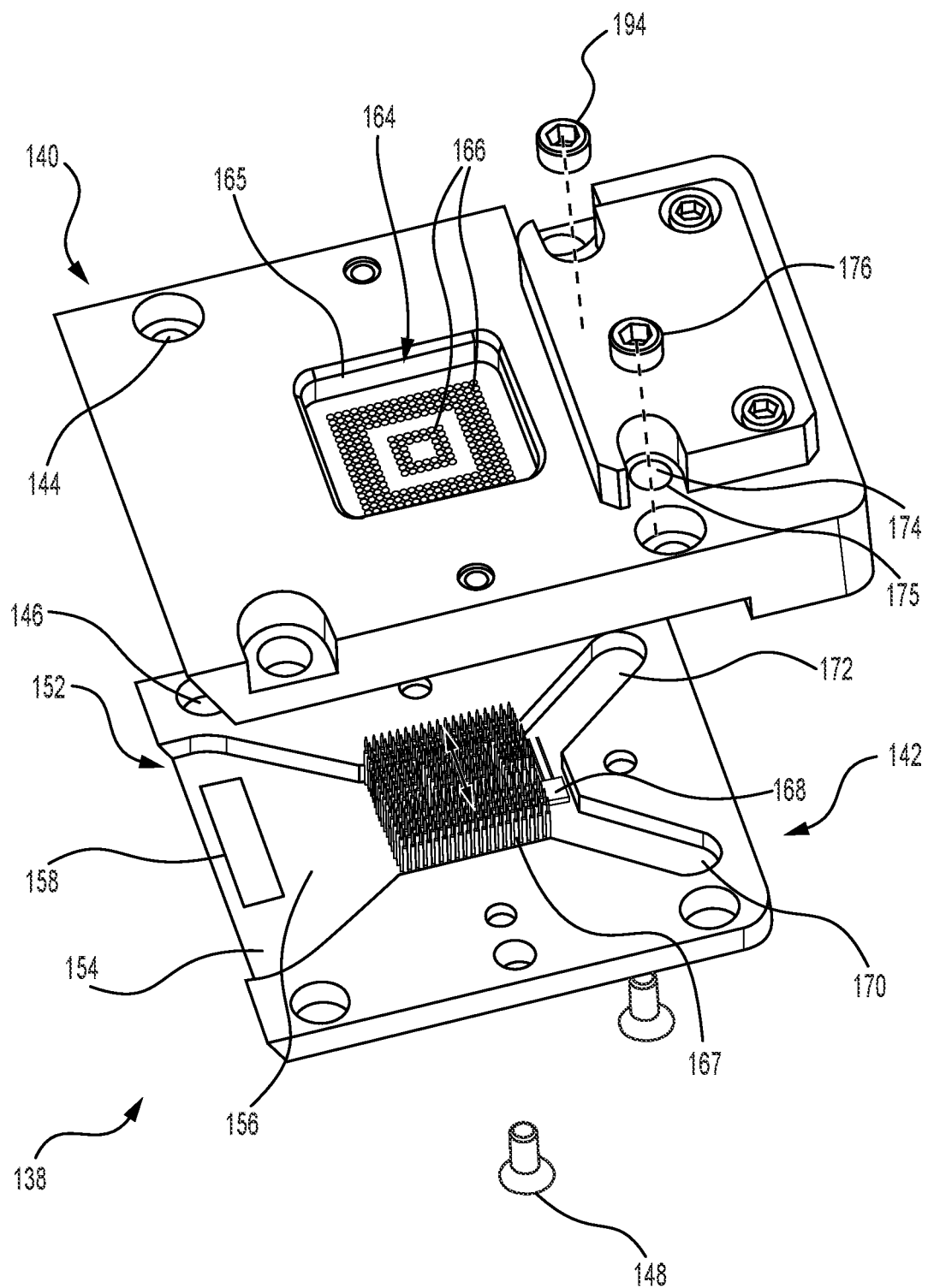
FIG. 3 illustrates an exploded view of a contactor assembly for a temperature control system, according to an embodiment.

As shown in FIG. 3, the contactor assembly 138 includes a housing 140 (e.g., base, etc.). The housing 140 is configured to interface with the target device 101. The contactor assembly 138 also includes a retaining plate 142 (e.g., body, etc.). The housing 140 is coupled to the retaining plate 142.

In some embodiments, the housing 140 includes at least one first coupling hole 144 (e.g., aperture, etc.). The retaining plate 142 also includes at least one second coupling hole 146 (e.g., aperture, etc.). The housing 140 is coupled (e.g., attached, affixed, screwed, bolted, fastened, etc.) to the retaining plate 142 using at least one coupler 148 (e.g., fastener, screw, bolt, etc.). Each of the couplers 148 extends through one of the second coupling holes 146 and one of the first coupling holes 144.

As shown in FIG. 5, the housing 140 also includes a housing channel (e.g., groove, slot, etc.). The housing channel is configured to receive the fluid. The housing 140 also includes a retaining plate channel 150 (e.g., groove, slot, etc.). When the housing 140 is coupled to the retaining plate 142, the housing channel is aligned (e.g., positioned, etc.) with the retaining plate channel 150 to form a channel system 152, as shown in FIGS. 1 and 3. The channel system 152 is configured to receive the fluid from the manifold 132 and transport the fluid throughout the contactor assembly 138. In some embodiments, the housing channel is omitted and the channel system 152 includes only the retaining plate channel 150. In some embodiments, the retaining plate channel 150 is omitted and the channel system 152 includes only the housing channel.

The channel system 152 includes an inlet channel 154. When the contactor assembly 138 is coupled to the contactor receiving location 136, the inlet channel 154 is coupled to the manifold 132 and configured to receive the fluid from the manifold 132. In this way, the fluid is provided to the contactor assembly 138.

The channel system 152 also includes a first body channel 156. The first body channel 156 is fluidly coupled to the inlet channel 154 and is configured to receive fluid from the inlet channel 154.

In some embodiments, the contactor assembly 138 includes an inlet valve 158 (e.g., flow control device, etc.). The inlet valve 158 is configured to regulate (e.g., control, modulate, etc.) the flow of the fluid through the inlet channel 154, and therefore the flow of the fluid to the first body channel 156. In some embodiments, the inlet valve 158 of a first contactor assembly 138 is controlled based on a temperature of the contacts of a second contactor assembly 138 (e.g., in addition to the temperature of the contacts of the first contactor assembly 138, instead of the temperature of the contacts of the first contactor assembly 138, etc.). In some embodiments, the contactor assembly 138 does not include the inlet valve 158.

Figure 4:
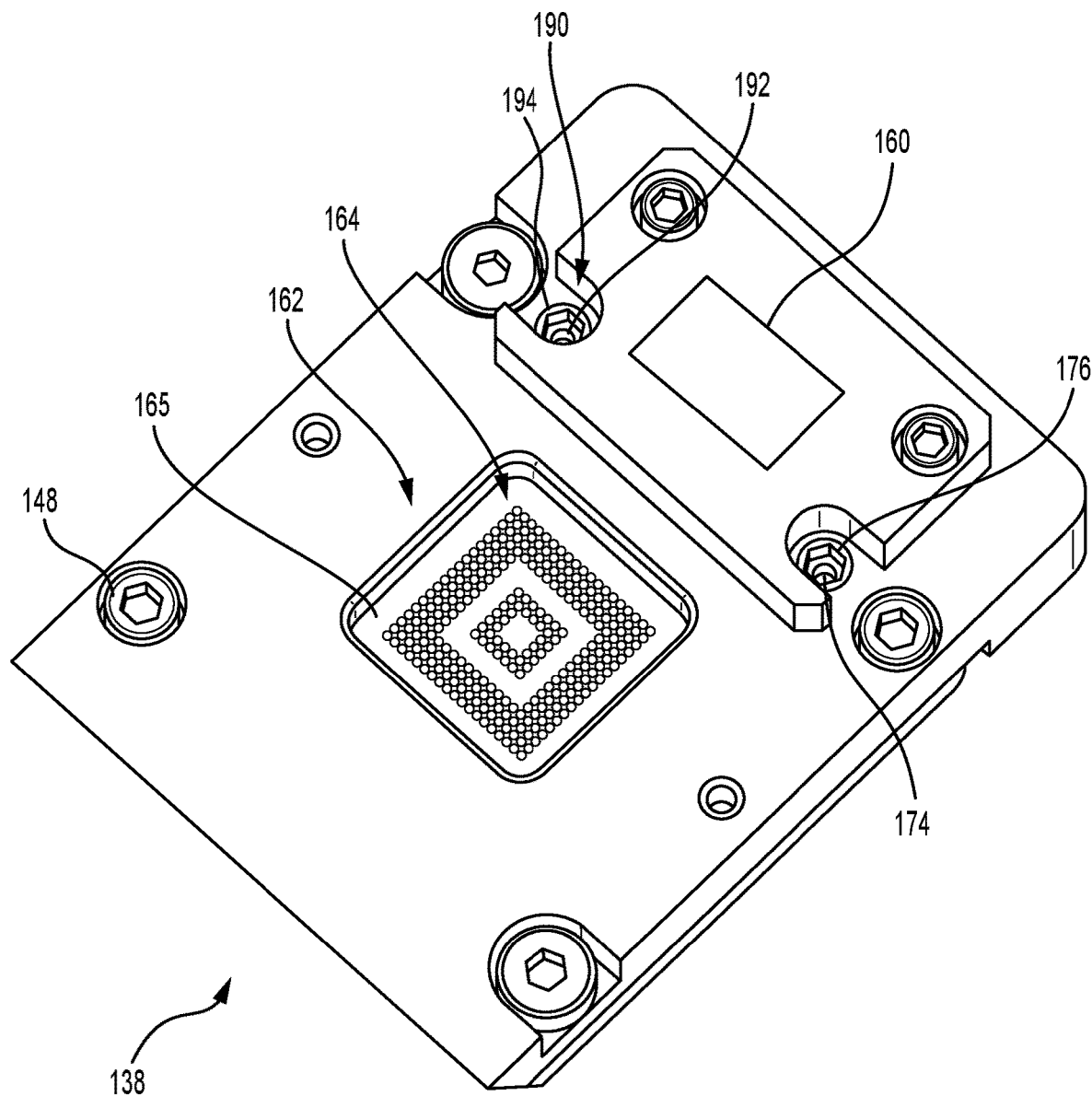
FIG. 4 illustrates a top perspective view of the contactor assembly shown in FIG. 3.

As shown in FIG. 4, the contactor assembly 138 includes a contactor terminal 160 (e.g., connector, etc.). The contactor terminal 160 is electrically connected to the testing device terminal 131. In this way, the contactor assembly 138 may receive electricity from the contactor terminal 160. Additionally, the contactor terminal 160 may receive signals from the temperature controller 112 through the testing device terminal 131.

The contactor assembly 138 also includes a socket 162. The socket 162 is electrically connected to the contactor terminal 160 and is configured to electrically connect to a target device 101 and transmit the temperature of the contacts of the first contactor assembly 138, an indication of whether the target device 101 is received in the socket 162, and other similar data to the contactor terminal 160. The socket 162 includes a socket housing 164. The socket housing 164 is included in the housing 140. The socket housing 164 includes a recess 165 (e.g., slot, depression, etc.). The recess 165 extends into the housing 140 and is contiguous with a top surface of the housing 140.

The socket housing 164 also includes a plurality of apertures 166 (e.g., holes, etc.). The apertures 166 are positioned within the recess 165. Each of the apertures 166 is configured to be aligned with and receive at least one contact 167 (e.g., pin, pogo pin, wire, etc.). The contacts 167 facilitate electrical connection of the target device 101 to the contactor assembly 138, and the contactor assembly 138 facilitates electrical connection to the testing device 130, as shown in FIG. 2. In various embodiments, the contacts 167 are electrically connected to the flow controller 112 via a load board (e.g., rather than via testing device terminal 131).

In some embodiments, one or more of the contacts 167 extends from the target device 101 and is received by the apertures 166 from the target device 101. In some embodiments, such as is shown in FIG. 3, the contacts 167 extend from the retaining plate 142. In some embodiments, the contacts 167 are pogo pins, elastomeric conductors, metallic "fuzz" buttons, and other similar electrically conductive members. In some embodiments the contacts 167 extend below the retaining plate 142, as shown in FIG. 5, and may connect to a load board.

Portions of each of the contacts 167 are positioned within the first body channel 156. As the fluid flows through the first body channel 156, the fluid flows through the contacts 167. As a result, the fluid provides heat to or removes heat from the contacts 167. In this way, the fluid may be used to heat or cool the contacts 167. Because the contacts 167 are electrically connected to the target device 101, heating or cooling of the contacts 167 enables testing of the target device 101 at various temperatures. The temperature controller 112 is configured to control the fluid so as to enable the target device 101 to be tested at the setpoint temperature.

The contactor assembly 138 includes a contactor assembly sensor 168 (e.g., temperature sensor, pressure sensor, RTD, etc.). The contactor assembly sensor 168 is configured to facilitate measurement of a property associated with the contacts 167 within the channel system 152. In some embodiments, the property is the temperature of the contacts 167. In some embodiments, the property is of the fluid within the channel system 152. For example, the property may be the temperature of the fluid within the channel system 152.

Figure 6:
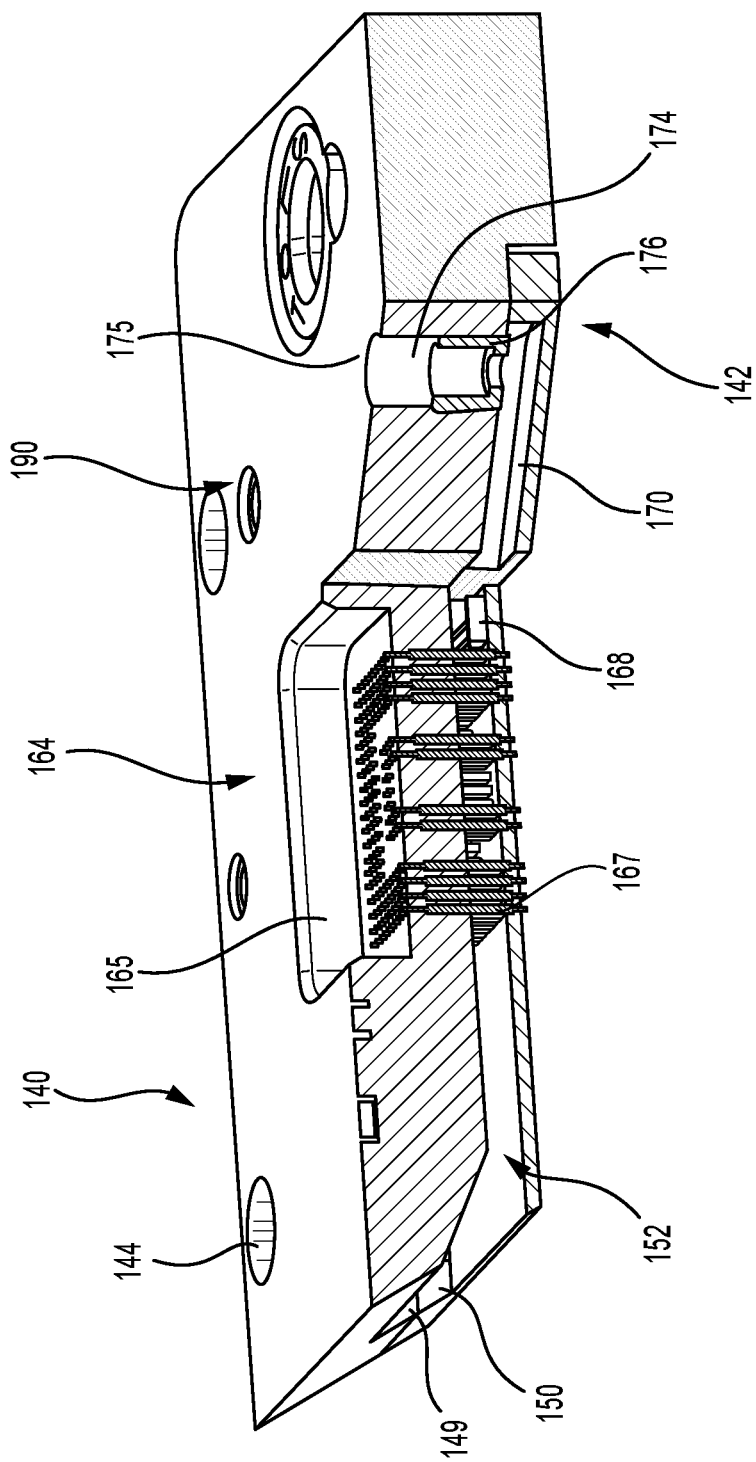
FIG. 6 is a cross-sectional view of the contactor assembly shown in FIG. 3.

In various embodiments, the contactor assembly sensor 168 is positioned within the first body channel 156 proximate the contacts 167. In some embodiments, such as is shown in FIGS. 1, 3, and 6, the contactor assembly sensor 168 is positioned within the first body channel 156 downstream of the contacts 167. In some embodiments, the contactor assembly sensor 168 is positioned within the first body channel 156 upstream of the contacts 167. In some embodiments where the temperature control system 100 includes a plurality of contactor assemblies 138, one or more of the contactor assemblies 138 in the plurality of contactor assemblies 138 does not include the contactor assembly sensor 168. In some embodiments, the contactor assembly sensor 168 is coupled to the contacts 167. This may, for example, facilitate measurement of the surface temperature of the contacts 167. In some embodiments, the contactor assembly sensor 168 is located in the socket 162.

The contactor assembly sensor 168 is electrically connected to the contactor terminal 160. In operation, the contactor assembly sensor 168 is configured to facilitate measurement of the property associated with the contacts 167. In some embodiments, the property associated with the contact 167 is temperature. The signal from the contactor assembly sensor 168 is then transmitted to the contactor terminal 160. The contactor terminal 160 transmits the signal to the testing device terminal 131, which then transmits the signal to the temperature controller 112. The temperature controller 112 then determines a reading of the property based on the signal. The processor 116 may store the reading in the memory 118.

In some embodiments, the processor 116 may determine the temperature of the contacts 167 based on the reading. For example, if the temperature of the contacts 167 is greater than the setpoint temperature, the processor 116 may adjust the heat exchanger 120 to provide less heat, or to provide additional cooling, to the fluid. In another example, the processor 116 may determine that the temperature of the contacts 167 is greater than the setpoint temperature and operate the cooling device 124 to cause the heat exchanger 120 to increase cooling provided to the fluid. In another example, the processor 116 may determine that the temperature of the contacts 167 is less than the setpoint temperature and operate the heating device 126 to increase heating provided to the fluid within the heat exchanger 120.

For example, in an example embodiment, if a target device 101 is being tested at a relatively high setpoint temperature (e.g., 363 K to 423 K, etc.), the processor 116 determines that the temperature of the contacts 167 is, for example, 90% or less of the setpoint temperature, the processor 116 causes the inlet valve 158 to be repositioned to an open position such that the fluid flow is not impeded by the inlet valve 158. In this way, more fluid flows through the contacts 167 and provides more heat to the contacts 167. By opening the inlet valve 158, more fluid flows through the contacts 167 which results in more heat exchange with the contacts 167. In this way, the inlet valve 158 may be controlled to enable the fluid, and therefore the contacts 167, to cause the temperature of the contacts 167 to be changed (e.g., increased, decreased, etc.) towards the setpoint temperature.

In some embodiments, when the processor 116 determines that the temperature of the contacts 167 is greater than the setpoint temperature, the processor 116 operates the inlet valve 158 to be repositioned to a closed position or a semi-closed position (e.g., 20% closed position, 40% closed position, 60% closed position, 80% closed position, etc.). In the closed position, the flow of the fluid is inhibited such that none of the fluid flows to the contacts 167. As used herein, it is understood that when flow of the fluid is "inhibited," flow of the fluid is not necessarily completely prevented.

In the semi-closed position, the flow of the fluid is impeded by the inlet valve 158 at the inlet channel 154 such that only a portion (e.g., 20%, 40%, 60%, 80%, etc.) of the fluid flows to the contacts 167 via the first body channel 156. By impeding the flow of the fluid using the inlet valve 158, the heating or cooling provided from the fluid to the contacts 167 is decreased (e.g., due to decreased flow of the fluid to the contacts 167, relative to when the flow of the fluid is not impeded by the inlet valve 158, etc.). In an example embodiment, if a target device 101 is being tested at a high setpoint temperature (e.g., within 5% of 363 K to 423 K, etc.), and the processor 116 determines that the temperature of the contacts 167 is substantially less (e.g., 15%, 20%, 40%, 60%, 80%, etc.) than the setpoint temperature, the processor 116 causes the inlet valve 158 to be opened (e.g., to be in the open position, to transition from a 60% closed position to a 20% closed position, etc.) such that the fluid flow is less impeded. In this way, the fluid provides more heating or cooling to the contacts 167 (e.g., due to increased flow of the fluid to the contacts 167, etc.) and allows for the contacts 167 to be heated or cooled to reach the target temperature value. In some embodiments, the inlet valve 158 is a bimorph valve or a butterfly valve, as described in more detail herein.

In some embodiments, the processor 116 determines that the temperature of the contacts 167 of a first contactor assembly 138 is greater than the setpoint temperature or less than the setpoint temperature and operates the inlet valve 158 of a second contactor assembly 138 accordingly (e.g., based on a comparison between the temperature of the contacts 167 of the first contactor assembly 138 and the setpoint temperature and based on a comparison between the temperature of the contacts 167 of the second contactor assembly 138 and the setpoint temperature etc.). For example, where the processor 116 determines that the temperature of the contacts 167 of the first contactor assembly 138 is substantially less than the setpoint temperature, the processor 116 may reposition the inlet valve 158 of the second contactor assembly 138 to be opened so as to cause additional fluid to be provided to the contacts 167 of the second contactor assembly 138 (e.g., in addition to opening the inlet valve 158 of the first contactor assembly 138). In some embodiments, the second contactor assembly 138 does not include the contactor assembly sensor 168, and the inlet valve 158 of the second contactor assembly 138 is operated based on the temperature of the contacts 167 of the first contactor assembly 138.

The channel system 152 also includes a first exhaust channel 170. The first exhaust channel 170 is contiguous with the first body channel 156 and receives the fluid from the first body channel 156. After flowing through or around the contacts 167, the fluid flows around the contactor assembly sensor 168 and into the first exhaust channel 170. The first exhaust channel 170 is configured to transport the fluid to a port, as described in more detail herein.

In various embodiments, channel system 152 also includes a second exhaust channel 172. The second exhaust channel 172 is contiguous with the first body channel 156 and receives the fluid from the first body channel 156. After flowing through or around the contacts 167, the fluid flows around the contactor assembly sensor 168 and into the second exhaust channel 172. The second exhaust channel 172 is configured transport the fluid to a port, as described in more detail herein. In some embodiments, the second exhaust channel 172 is positioned such that the first exhaust channel 170 and the second exhaust channel 172 are separated by an angle on the retaining plate 142 that is approximately equal to between 20 degrees (°) and 80° (e.g., 19°, 20°, 30°, 40°, 45°, 50°, 65°, 70°, 80°, 84°, etc.).

The housing 140 includes a first port 174. The first port 174 is contiguous with the first exhaust channel 170 and receives the fluid from the first exhaust channel 170. The housing 140 also includes a first outlet 175. The first outlet 175 is contiguous with the first port 174 and receives the fluid from the first port 174. The first outlet 175 provides the fluid to ambient (e.g., atmosphere, an environment surrounding the temperature control system 100, etc.).

In various embodiments, the contactor assembly 138 also includes a first exhaust valve 176. The first exhaust valve 176 is disposed within the first port 174. In some applications, it is desired that the first exhaust valve 176 be physically separated from the housing 140. For example, where the housing 140 is subjected to relatively extreme temperatures, it may be desirable to separate the first exhaust valve 176 from the housing 140 to protect the first exhaust valve 176 from these extreme temperatures. Additionally, it may be desirable to physically separate the first exhaust valve 176 from the housing 140 where space constraints limit an overall size or shape of the housing 140. It is possible to physically separate the first exhaust valve 176 from the housing 140 by including a tube (e.g., conduit, pipe, etc.) extending from the first port 174. In these embodiments, the tube forms part of the first port 174 and facilitates physical separation of the first exhaust valve 176.

The first exhaust valve 176 is configured to regulate the flow of the fluid as the fluid flows from the first exhaust channel 170 through the first outlet 175. By regulating the flow of the fluid within the contactor assembly 138, the temperature of the contacts 167 may be controlled. In some embodiments, the contactor assembly 138 includes the first exhaust valve 176 and the inlet valve 158. In other embodiments, the contactor assembly 138 includes only one of the first exhaust valve 176 or the inlet valve 158. In some embodiments, the first exhaust valve 176 of a first contactor assembly 138 is controlled based on a temperature of the contacts 167 within a second contactor assembly 138 (e.g., in addition to the temperature of the contacts 167 of the first contactor assembly 138, instead of the temperature of the contacts 167 of the first contactor assembly 138, etc.).

For example, in an example embodiment, if a target device 101 is being tested at a relatively high setpoint temperature, and the processor 116 determines that the temperature of the contacts 167 is, for example, 120% or more of the setpoint temperature (e.g., too hot), the processor 116 causes the first exhaust valve 176 to be repositioned to a closed position such that the fluid flow is increasingly impeded by the first exhaust valve 176. In this way, fluid flow through the channel system 152, and therefore across the contacts 167, is decreased (e.g., relative to when the flow of the fluid is not impeded by the first exhaust valve 176, etc.). This decrease in flow to the contacts 157 causes decreased heat transfer from the fluid to the contacts 167 because the fluid has a relatively low thermal capacity and less flow to the contacts 157 results in less heat transfer to the contacts 157. However, in an example where the target device 101 is being tested at a relatively high setpoint temperature, and the processor 116 determines that the temperature of the contacts 167 is, for example, 80% or less of the setpoint temperature (e.g., too cold), the processor 116 causes the first exhaust valve 176 to be repositioned to an open position such that the fluid flow is decreasingly impeded by the first exhaust valve 176. In this way, more of the fluid flows through the contacts 167 and provides more heating to the contacts 167. As a result, the first exhaust valve 176 may be controlled to enable the fluid, and therefore the contacts 167, to cause the temperature of the contacts 167 to be changed towards the setpoint temperature.

In some embodiments, when the processor 116 determines that the temperature of the contacts 167 is greater than the setpoint temperature, the processor 116 operates the first exhaust valve 176 to be repositioned to a closed position or a semi-closed position. In the closed position, the flow of the fluid is inhibited such that none of the fluid flows through the first outlet 175. In the semi-closed position, the flow of the fluid is impeded by the first exhaust valve 176 such that only a portion of the fluid flows through the first outlet 175. By impeding the flow of the fluid using the first exhaust valve 176, the heat exchange with the contacts 167 is decreased (e.g., relative to when the flow of the fluid is not impeded by the first exhaust valve 176, etc.) due to the relatively low thermal capacity of the fluid and less flow to the contacts 157 results in less heat transfer to the contacts 157. In an example embodiment, if a target device 101 is being tested at a high setpoint temperature (e.g., 363 K to 423K, etc.), and the processor 116 determines that the temperature of the contacts 167 is substantially greater (e.g., 15%, 20%, 40%, 60%, etc.) than the setpoint temperature (e.g., too hot), the processor 116 causes the first exhaust valve 176 to be repositioned to be closed (e.g., to be in the closed position, to transition from a 20% closed position to a 60% closed position, etc.) such that the fluid flow is impeded. By impeding the flow of the fluid towards the contacts 167, the heat exchange with the contacts 167 is decreased. In an example embodiment, if a target device 101 is being tested at a high setpoint temperature (e.g., 363 K to 423 K, etc.), the processor 116 determines that the temperature of the contacts 167 is substantially less (e.g., 15%, 20%, 40%, 60%, 80%, etc.) (e.g., too cold) than the setpoint temperature, the processor 116 causes the first exhaust valve 176 to repositioned to be open (e.g., to be in the open position, to transition from a 20% open position to a 60% open position, etc.) such that the fluid flow is less impeded. By reducing impedance of the fluid flow towards the contacts 167, the heat exchange with the contacts 167 is increased. In some embodiments, the first exhaust valve 176 is a bimorph valve or a butterfly valve, as described in more detail herein.

In some embodiments, a target device 101 is only being tested for a limited time (e.g., 10 seconds (s), 20 s, 30 s, etc.). Due to the limited time of testing, the processor 116 determines the temperature of the contacts 167 during a test (e.g., first test, second test, etc.) and repositions the first exhaust valve 176 as described herein for a following test (e.g., second test, third test, fourth test, etc.). For example, during a first test the processor 116 may determine that the temperature of the contacts 167 during the test was greater than the setpoint temperature or less than the setpoint temperature. The processor 116 may then operate the first exhaust valve 176 to be repositioned to a closed position, a semi-closed position, or an open position such that the temperature of the contacts 167 is caused to approximately equal the setpoint temperature for a following test.

In some embodiments, the first exhaust valve 176 is automated such that the first exhaust valve 176 is controlled by the temperature controller 112. The first exhaust valve 176 is electrically connected to the contactor terminal 160. In operation, the fluid flows through the contacts 167 to the contactor assembly sensor 168. The contactor assembly sensor 168 is configured to facilitate measurement of the property of the fluid flowing downstream of the contacts 167 and the measurement is then transmitted to the contactor terminal 160. In various embodiments, the contactor terminal 160 transmits the measurement to the testing device terminal 131, which is then transmitted to the temperature controller 112. In some embodiments, the contactor terminal 160 transmits the measurement to the temperature controller 112 directly (e.g., without use of the testing device terminal 131, etc.). The processor 116 on the temperature controller 112 receives the measurement and stores the measurement in the memory 118. In some embodiments, the processor 116 may calculate a temperature of the contacts 167 from the measurement. In some embodiments, the measurement received by the processor 116 is the temperature of the contacts 167. The processor 116 compares the temperature of the contacts 167 from the contactor assembly sensor 168 with the setpoint temperature stored on the memory 118.

In some embodiments, the processor 116 may determine that the temperature of the contacts 167 is approximately equal to the setpoint temperature and the processor 116 not adjust the first exhaust valve 176. In some embodiments, the processor 116 may determine that the temperature of the contacts 167 is greater than the setpoint temperature or less than the setpoint temperature stored on the memory 118 and may adjust the first exhaust valve 176.

In some embodiments, the processor 116 repositions the first exhaust valve 176 to the open position such that the fluid in the first exhaust channel 170 may freely flow through the first port 174 and out of the first outlet 175 into the atmosphere. By allowing the fluid to freely flow through the first port 174 and out of the first outlet 175, the heat transfer at the socket 162 is increased because more fluid flows through the contacts 167 to the first exhaust channel 170 and out of the first outlet 175 without being restricted.

In some embodiments, the processor 116 operates the first exhaust valve 176 to the closed position such that the fluid in the first exhaust channel 170 is restricted from flowing through the first port 174 and out of the first outlet 175 into the atmosphere. By restricting the fluid to flow through the first port 174 and out of the first outlet 175, the heat transfer at the socket 162 is decreased (e.g., relative to when the flow of the fluid is not impeded by the first exhaust valve 176, etc.). The fluid is restricted from flowing through the contacts 167 to the first exhaust channel 170 through the first port 174 and out of the first outlet 175. Here, the fluid remains within the channel system 152, which decreases heat transfer because the fluid has a relatively low thermal capacity.

In some embodiments, the processor 116 operates the first exhaust valve 176 to a semi-closed position such that flow of the fluid is partially restricted by the first exhaust valve 176. By partially restricting the flow of the fluid, the rate at which heat transfer between the fluid and the contacts 167 varies based on is the position of the first exhaust valve 176. For example, in some embodiments, when the processor 116 operates the first exhaust valve 176 to in the 20% closed position, the heat transfer between the fluid and the contacts 167 will be greater than when the processor 116 operates the first exhaust valve 176 to be 80% closed.

In some embodiments, the processor 116 determines that the temperature of the contacts 167 of a first contactor assembly 138 is greater than the setpoint temperature or less than the setpoint temperature and operates the first exhaust valve 176 of a second contactor assembly 138 accordingly (e.g., based on a comparison between the temperature of the contacts 167 of the first contactor assembly 138 and the setpoint temperature and based on a comparison between the temperature of the contacts 167 of the second contactor assembly 138 and the setpoint temperature etc.). For example, where the processor 116 determines that the temperature of the contacts 167 of the first contactor assembly 138 is substantially less than the setpoint temperature and the target device 101 is being tested at a high setpoint temperature, the processor 116 may reposition the first exhaust valve 176 to be opened so as to cause additional fluid to be provided to the contacts 167 of the second contactor assembly 138. In some embodiments, the second contactor assembly 138 does not include the contactor assembly sensor 168, and the first exhaust valve 176 of the second contactor assembly 138 is operated based on the temperature of the contacts 167 of the first contactor assembly 138.

Figure 7:
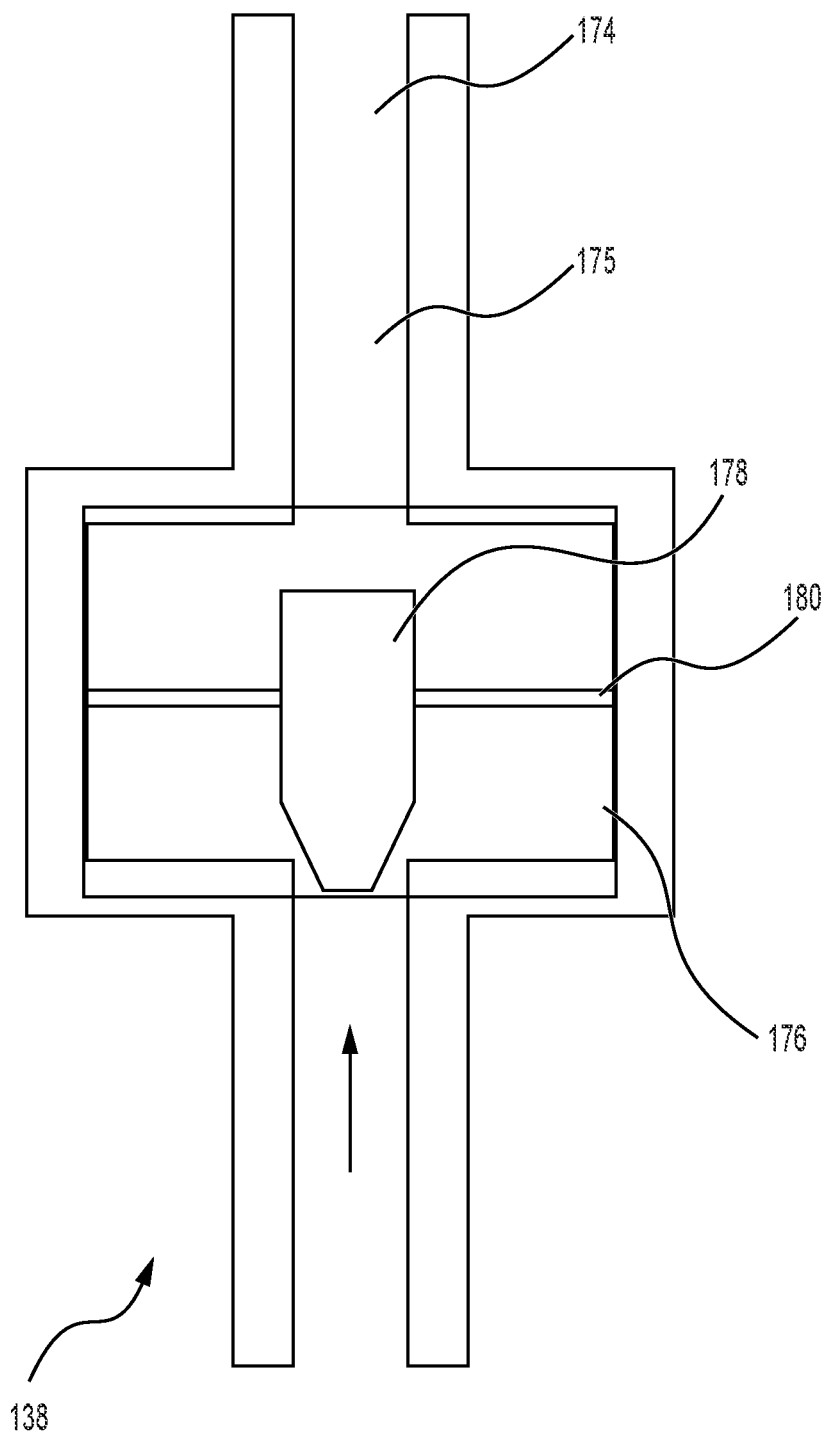
FIG. 7 illustrates a portion of the contactor assembly shown in FIG. 3, according to an embodiment.

In some embodiments, such as is shown in FIG. 7, the first exhaust valve 176 is a bimorph valve. In these embodiments, the first exhaust valve 176 includes a valve member 178 and also includes a piezoelectric actuator 180. The valve member 178 is configured to regulate the flow of fluid through the first port 174. The piezoelectric actuator 180 is electrically connected to the contactor terminal 160 and is configured to cause the valve member 178 to operatively change between an open, a closed, and a semi-closed position, and changes curvature based on voltage applied to the valve member 178. In some embodiments, the piezoelectric actuator 180 is a plate. In operation, the fluid flows through the contacts 167 to the contactor assembly sensor 168. The contactor assembly sensor 168 is configured to facilitate measurement of a property associated with the contacts 167 and the measurement is then transmitted to the contactor terminal 160. The contactor terminal 160 transmits the measurement to the testing device terminal 131, which is then transmitted to the temperature controller 112. The processor 116 on the temperature controller 112 receives the measurement and stores the measurement in the memory 118. In some embodiments, the processor 116 may calculate the temperature of the contacts 167 from the measurement. In some embodiments, the measurement of the property received by the processor 116 is the temperature of the contacts 167. The processor 116 compares the temperature of the contacts 167 with the setpoint temperature stored on the memory 118. In some embodiments, the processor 116 may determine that the temperature of the contacts 167 is approximately equal to the setpoint temperature and the processor does not transmit a command to provide voltage to the piezoelectric actuator 180 and therefore operate the piezoelectric actuator 180. In some embodiments, the processor 116 may determine that the temperature of the contacts 167 is approximately equal to the setpoint temperature and the processor 116 transmits a command to provide voltage to the piezoelectric actuator 180 and therefore operate the piezoelectric actuator 180 such that the valve member 178 maintains the target position.

In some embodiments, the processor 116 may determine that the temperature of the contacts 167 is greater than the setpoint temperature or less than the setpoint temperature stored on the memory 118. In some embodiments, the processor 116 transmits a command to the piezoelectric actuator 180 to provide voltage to the piezoelectric actuator 180 and therefore operate the valve member 178 to an open position such that the fluid in the first exhaust channel 170 may freely flow through the first port 174 and out of the first outlet 175 into the atmosphere. The piezoelectric actuator 180 may cause the valve member 178 to be in an open position. By allowing the fluid to freely flow through the first port 174 and out of the first outlet 175, the heat transfer at the socket 162 is increased because more fluid flows through the contacts 167 to the first exhaust channel 170 and out of the first outlet 175 without being restricted.

In some embodiments, the processor 116 transmits a command to the piezoelectric actuator 180 to provide voltage to the piezoelectric actuator 180 and therefore operate the valve member 178 to a closed position such that the fluid in the first exhaust channel 170 is restricted from flowing through the first port 174 and out of the first outlet 175 into the atmosphere. The piezoelectric actuator 180 may cause the valve member 178 to be in a closed position such that the first port 174 and the first outlet 175 are no longer fluidly coupled. By restricting the fluid to flow through the first port 174 and out of the first outlet 175, the heat transfer at the socket 162 is decreased (e.g., relative to when the flow of the fluid is not impeded by the valve member 178, etc.). The fluid is restricted from flowing through the contacts 167 to the first exhaust channel 170 through the first port 174 and out of the first outlet 175 and remains within the channel system 152, which decreases the heat transfer. This may be because the fluid may have a relatively low thermal capacity which causes the fluid to lose heat (e.g., when the fluid had been heated, etc.), or gain heat (e.g., when the fluid had been cooled, etc.), within the channel system 152 as the fluid flows through the contacts 167. Additionally, because the fluid is restricted from flowing through the first port 174, more fluid is impeded from flowing into the contactor assembly 138 which decreases heat transfer to the contacts 167.

In some embodiments, the processor 116 transmits a command to the piezoelectric actuator 180 to provide voltage to the piezoelectric actuator 180 and therefore operate the valve member 178 to a semi-closed position such that flow of the fluid is partially restricted. The piezoelectric actuator 180 may cause the valve member 178 to partially open such that the first port 174 and the first outlet 175 are partially fluidly coupled. By partially restricting the flow of the fluid, the rate at which heat transfer between the fluid and the contacts 167 varies based on the position of the valve member 178 provided by the piezoelectric actuator 180. For example, in some embodiments, the electrical charge transmitted from the piezoelectric actuator 180 to the processor 116 causes the valve member 178 to be positioned such that 80% of the fluid flows through first port 174 and out of the first outlet 175. When 80% of the fluid flows through first port 174 and out of the first outlet 175, the heat transfer between the fluid and the contacts 167 will be greater than when the processor 116 causes the valve member 178 to be positioned such that 20% of the fluid flows through first port 174 and out of the first outlet 175. In some embodiments, the inlet valve 158 (as shown in FIG. 1) is configured as a bimorph valve and operatively works in a similar fashion as described above.

Figure 8:
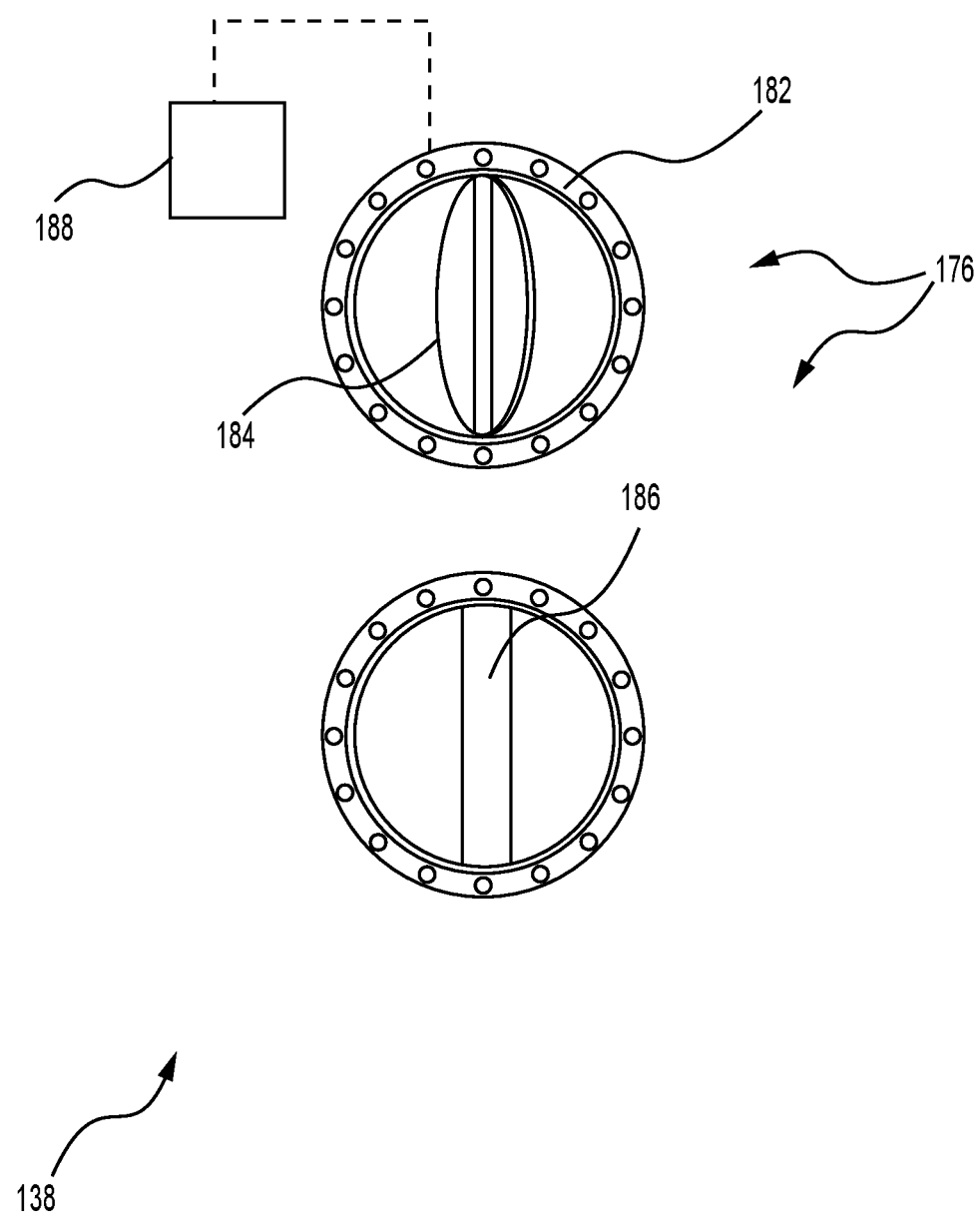
FIG. 8 illustrates a portion of the contactor assembly shown in FIG. 3, according to an embodiment.

In some embodiments, such as shown in FIG. 8, the first exhaust valve 176 is a butterfly valve. In these embodiments, the contactor assembly 138 includes a first exhaust valve 176, which may be configured to be a butterfly valve. The butterfly valve as shown in FIG. 8 includes a mounting body 182. The mounting body 182 is configured to be disposed within the first port 174. The mounting body 182 may be coupled, within the first port 174. The butterfly valve configuration of the first exhaust valve 176 also includes a butterfly valve member 184. The butterfly valve member 184 is configured to regulate the flow of fluid through the first port 174. The butterfly valve member 184 is coupled to a connecting rod 186. The connecting rod 186 is coupled (e.g., hinge, pin assembly, etc.) to the mounting body 182 and is configured to rotate the butterfly valve member 184 about the connecting rod 186 within the mounting body 182. The contactor assembly 138 also includes an electrical connect device 188 (e.g., actuator, etc.). The electrical connect device 188 is disposed near the first port 174 and is electrically connected to the contactor terminal 160. The electrical connect device 188 is configured to electrically operate the first exhaust valve 176. The electrical connect device 188 causes the butterfly valve member 184 to rotate about the connecting rod 186 within the mounting body 182 and operatively change between an open, a closed, and a semi-closed position when the processor 116 transmits a command to the electrical connect device 188.

The electrical connect device 188 receives a command transmitted from the processor 116. The command is electrically transmitted through the testing device terminal 131 and further through the contactor terminal 160 to the electrical connect device 188. Upon receiving the electrical command from the processor 116, the electrical connect device 188 operatively rotates the connecting rod 186 such that the butterfly valve member 184 is rotatably repositioned.

In operation (as shown in FIG. 1), the fluid flows through the contacts 167 to the contactor assembly sensor 168. The contactor assembly sensor 168 is configured to facilitate measurement of the property associated with the contacts 167 and the measurement is then transmitted to the contactor terminal 160. The contactor terminal 160 transmits the measurement to the testing device terminal 131, which is then transmitted to the temperature controller 112. The processor 116 on the temperature controller 112 receives the measurement and stores the measurement in the memory 118. In some embodiments, the processor 116 may calculate the temperature of the contacts 167 from the measurement. In some embodiments, the measurement of the property received by the processor 116 is the temperature of the contacts 167. The processor 116 compares the temperature of the contacts 167 from the contactor assembly sensor 168 with the setpoint temperature stored on the memory 118. In some embodiments, the processor 116 may determine that the temperature of the contacts 167 is approximately equal to the setpoint temperature and the processor 116 does not transmit a command to the electrical connect device 188 to operate the connecting rod 186. In some embodiments, the processor 116 may determine that the temperature of the contacts 167 is approximately equal to the setpoint temperature and the processor 116 transmits a command to the electrical connect device 188 to maintain the butterfly valve member 184 in the target position.

In some embodiments, the processor 116 transmits a command to the electrical connect device 188 to operate the connecting rod 186 to an open position such that the fluid in the first exhaust channel 170 may freely flow through the first port 174 and out of the first outlet 175 into the atmosphere. The electrical connect device 188 receives a command from the processor 116 and operatively rotates the connecting rod 186 such that the butterfly valve member 184 is in an open position. When the butterfly valve member 184 is in the open position, the fluid may flow freely within the first port 174 through the mounting body 182 and out of the first outlet 175. In some embodiments, the butterfly valve member 184 is considered in the open position when the butterfly valve member 184 is perpendicular to the mounting body as shown in FIG. 8. By allowing the fluid to freely flow through the first port 174 and out of the first outlet 175, the heat transfer at the socket 162 is increased because the fluid flows through the contacts 167 to the first exhaust channel 170 and out of the first outlet 175 without being restricted.

In some embodiments, the processor 116 transmits a command to the electrical connect device 188 to operate the connecting rod 186 to a closed position such that the fluid in the first exhaust channel 170 is restricted from flowing through the first port 174 and out of the first outlet 175 into the atmosphere. The electrical connect device 188 receives a command from the processor 116 and operatively rotates the connecting rod 186 such that the butterfly valve member 184 is in a closed position. When the connecting rod 186 is in the closed position, the first port 174 and the first outlet 175 are no longer fluidly coupled. In some embodiments, the butterfly valve member 184 is considered to be in a closed position when the butterfly valve member is parallel to the mounting body 182 as shown in FIG. 8. By restricting the fluid to flow through the first port 174 and out of the first outlet 175, the heat transfer at the socket 162 is decreased (e.g., relative to when the flow of the fluid is not impeded by the butterfly valve member 184, etc.). The fluid is restricted from flowing through the connectors to the first exhaust channel 170 through the first port 174 and out of the first outlet 175 and remains within the channel system 152, which decreases heat transfer.

In some embodiments, the processor 116 transmits a command to the electrical connect device 188 to operate the connecting rod 186 such that the butterfly valve member 184 is in a semi-closed position. When the butterfly valve member 184 is in a semi-closed position, that flow of the fluid is partially restricted. The electrical connect device 188 receives a command from the processor 116 and operatively rotates the connecting rod 186 such that the butterfly valve member 184 is partially rotated. When the butterfly valve member 184 is partially rotated, the first port 174 and the first outlet 175 are partially fluidly coupled. In some embodiments, the butterfly valve member 184 is considered partially rotated when the butterfly valve member 184 is offset by an angle (e.g., 20°, 25°, 30°, 40°, 45°, 50°, 60°, 70°, 75°, 80°, etc.) with respect to the mounting body 182. By partially restricting the flow of the fluid, the rate at which heat transfer between the fluid and the contacts 167 varies based on the rotation of the butterfly valve member 184 with respect to the mounting body 182. For example, in some embodiments, the electrical connect device 188 operatively rotates the connecting rod 186 such that the butterfly valve member 184 is rotated to allow 80% of the fluid flows through first port 174 and out of the first outlet 175. When 80% of the fluid flows through first port 174 and out of the first outlet 175, the heat transfer between the fluid and the contacts 167 will be substantially greater, however, if the electrical connect device 188 operatively rotates the connecting rod 186 such that the butterfly valve member 184 is rotated to allow 20% of the fluid flows through first port 174 and out of the first outlet 175, the heat transfer between the fluid and the contacts 167 will be substantially less. In some embodiments, the inlet valve 158 (as shown in FIG. 1) is configured as a butterfly valve and operatively works in a similar fashion as described above.

In some embodiments, the first exhaust valve 176 is a rotatable insert. For example, the temperature controller 112 may provide the temperature of the contacts 167 and the setpoint temperature to the user via a display, and the user may manually adjust the first exhaust valve 176 (e.g., using a tool, etc.), so as to cause the temperature of the contacts 167 to reach the setpoint temperature.

In one embodiment, the rotatable insert is configured to enable a user to manually adjust and control the heat provided to the contacts 167 from the fluid such that the contacts 167 reach a setpoint temperature. In operation, the fluid flows through the contacts 167 to the contactor assembly sensor 168. The contactor assembly sensor 168 is configured to facilitate measurement of a property associated with the contacts 167 and the measurement is then transmitted to the contactor terminal 160. The contactor terminal 160 transmits the measurement to the testing device terminal 131, which is then transmitted to the temperature controller 112. The temperature controller 112 receives the measurement and in some embodiments, displays the measurement to a user. The user then adjusts the rotatable insert. In some embodiments, the user adjusts the rotatable insert such that the rotatable insert fully extends into the first exhaust channel 170 based on the measurement displayed by the temperature controller 112. Here, the first exhaust valve 176 is in a closed position as to inhibit the flow of the fluid from the first exhaust channel 170 to the first port 174. This allows for the heat provided to the contacts 167 from the fluid to be decreased. In some embodiments, the user adjusts the rotatable insert such that a portion of the rotatable insert extends into the first exhaust channel 170 based on the measurement displayed by the temperature controller 112. Here, the first exhaust valve 176 is in a semi-closed position as to restrict the flow of the fluid from the first exhaust channel 170 to the first port 174. In some embodiments, the user adjusts the rotatable insert such that the rotatable insert is disposed entirely within the first port 174 and no portion of the rotatable insert extends into the first exhaust channel 170. Here, the first exhaust valve 176 is in an open position as to allow the fluid to flow from the first exhaust channel 170 through the first port 174 and out of to the first outlet 175. This enables the heat provided to the contacts 167 from the fluid to be increased. This operation may be used, for example, to calibrate heat transfer in the temperature control system 100 (e.g., where the temperature control system exhibits stable and repeatable characteristics, etc.).

In various embodiments, the contactor assembly 138 also includes a second exhaust valve 194. The second exhaust valve 194 is disposed within the second port 191. In some applications, it is desired that the second exhaust valve 194 be physically separated from the housing 140. For example, where the housing 140 is subjected to relatively extreme temperatures, it may be desirable to separate the second exhaust valve 194 from the housing 140 to protect the second exhaust valve 194 from these extreme temperatures. Additionally, it may be desirable to physically separate the second exhaust valve 194 from the housing 140 where space constraints limit an overall size or shape of the housing 140. It is possible to physically separate the second exhaust valve 194 from the housing 140 by including a tube (e.g., conduit, pipe, etc.) extending from the second port 191. In these embodiments, the tube forms part of the second port 191 and facilitates physical separation of the second exhaust valve 194.

The second exhaust valve 194 is configured to regulate the flow of the fluid as the fluid flows from the second exhaust channel 172 through the second outlet. By regulating the flow of the fluid within the contactor assembly 138, the temperature of the contacts 167 may be controlled. In some embodiments, the contactor assembly 138 includes the second exhaust valve 194 and the inlet valve 158. In other embodiments, the contactor assembly 138 includes only one of the second exhaust valve 194 or the inlet valve 158. In some embodiments, the contactor assembly 138 includes the first exhaust valve 176 and the second exhaust valve 194, but does not include the inlet valve 158. In some embodiments, the contactor assembly 138 includes only the inlet valve 158, but does not include the first exhaust valve 176 or the second exhaust valve 194. In some embodiments, the contactor assembly 138 includes the inlet valve 158 and one of the first exhaust valve 176 or the second exhaust valve 194. In some embodiments, the contactor assembly 138 includes one of the inlet valve 158, the first exhaust valve 176, or the second exhaust valve 194. In some embodiments, the second exhaust valve 194 of a first contactor assembly 138 is controlled based on a temperature of the contacts 167 of a second contactor assembly 138 (e.g., in addition to the temperature of the contacts 167 of the first contactor assembly 138, instead of the temperature of the contacts 167 of the first contactor assembly 138, etc.).

For example, in an example embodiment, if a target device 101 is being tested at a relatively high setpoint temperature, and the processor 116 determines that the temperature of the contacts 167 is, for example, 120% or more of the setpoint temperature, the processor 116 causes the second exhaust valve 194 to be repositioned to a closed position such that the fluid flow is increasingly impeded by the second exhaust valve 194. In this way, fluid flow through the channel system 152, and therefore across the contacts 167, is decreased (e.g., relative to when the flow of the fluid is not impeded by the second exhaust valve 194, etc.). This decrease causes decreased heat transfer from the fluid to the contacts 167 because the fluid has a relatively low thermal capacity. However, in an example where the processor 116 determines that the temperature of the contacts 167 is, for example, 80% or less of the setpoint temperature, the processor 116 causes the second exhaust valve 194 to be repositioned to an open position such that the fluid flow is decreasingly impeded by the second exhaust valve 194. In this way, the fluid flows through the contacts 167 and provides more heating to the contacts 167. As a result, the second exhaust valve 194 may be controlled to enable the fluid, and therefore the contacts 167, to cause the temperature of the contacts 167 to be changed towards the setpoint temperature.

In some embodiments, when the processor 116 determines that the temperature of the contacts 167 is greater than the setpoint temperature or less than the setpoint temperature, the processor 116 operates the second exhaust valve 194 to a closed position or a semi-closed position. In the closed position, the flow of the fluid is inhibited such that none of the fluid flows through the second outlet 192. In the semi-closed position, the flow of the fluid is impeded by the second exhaust valve 194 such that only a portion of the fluid flows through the second outlet 192. By impeding the flow of the fluid using the second exhaust valve 194, the heating or cooling provided from the fluid to the contacts 167 is decreased (e.g., relative to when the flow of the fluid is not impeded by the second exhaust valve 194, etc.). The heat transfer is decreased because the fluid may be restricted in the channel system 152 and due to the relatively low thermal capacity of the fluid, the fluid experiences a loss of heating or cooling before flowing through the contacts 167. In an example embodiment, if a target device 101 is being tested at a high setpoint temperature (e.g., less than 5% of 363 K to 423 K, etc.), and the processor 116 determines that the temperature of the contacts 167 is substantially greater than the setpoint temperature, the processor 116 causes the second exhaust valve 194 to repositioned to be closed (e.g., to be in the closed position, to transition from a 20% closed position to a 60% closed position, etc.) such that the fluid flow is impeded. By impeding the flow of the fluid towards the contacts 167, the fluid provides less heating to the contacts 167. In an example embodiment, if a target device 101 is being tested at a high setpoint temperature (e.g., within 5% of 363 K to 423 K, etc.), the processor 116 determines that the temperature of the contacts is substantially less than the setpoint temperature. The processor 116 repositions the second exhaust valve 194 to be open (e.g., to be in the open position, to transition from a 20% open position to a 60% open position, etc.) such that the fluid flow is less impeded. By reducing impedance of the fluid flow towards the contacts 167, the fluid provides more heating, in some embodiments where the tested device is tested at a high setpoint temperature or cooling, in some embodiments where tested device is tested at a low setpoint temperature, to the contacts 167. In some embodiments, the second exhaust valve 194 is a bimorph valve or a butterfly valve, as described in more detail herein.

In some embodiments, a target device 101 is only being tested for a limited time (e.g., 10 s, 20 s, 30 s, etc.). Due to the limited time of testing, the processor 116 determines the temperature of the contacts 167 during a test (e.g., first test, second test, etc.) and repositions the second exhaust valve 194 as described herein for a following test (e.g., second test, third test, fourth test, etc.). For example, during a first test the processor 116 may determine that the temperature of the contacts 167 during the test was greater than the setpoint temperature or less than the setpoint temperature. The processor 116 may then operate the second exhaust valve 194 to be repositioned to a closed position, a semi-closed position, or an open position such that the temperature of the contacts 167 is caused to approximately equal the setpoint temperature for a following test.

In some embodiments, the second exhaust valve 194 is automated such that the second exhaust valve 194 is controlled by the temperature controller 112. The second exhaust valve 194 is electrically connected to the contactor terminal 160. In operation, the fluid flows through the contacts 167 to the contactor assembly sensor 168. The contactor assembly sensor 168 is configured to facilitate measurement of a property associated with the contacts 167 and the measurement is then transmitted to the contactor terminal 160. The contactor terminal 160 transmits the measurement to the testing device terminal 131, which is then transmitted to the temperature controller 112. The processor 116 on the temperature controller 112 receives the measurement and stores the measurement in the memory 118. In some embodiments, the processor 116 may calculate a temperature of the contacts 167 from the measurement. In some embodiments, the measurement of the property received by the processor 116 is the temperature of the contacts 167. The processor 116 compares the temperature of the contacts 167 from the contactor assembly sensor 168 with the setpoint temperature stored on the memory 118.

In some embodiments, the processor 116 may determine that the temperature of the contacts 167 is approximately equal to the setpoint temperature and the processor 116 not adjust the second exhaust valve 194. In some embodiments, the processor 116 may determine that the temperature of the contacts 167 is greater than the setpoint temperature or less than the setpoint temperature stored on the memory 118 and may adjust the second exhaust valve 194. The processor 116 may reposition the second exhaust valve 194.

In some embodiments, the processor 116 repositions the second exhaust valve 194 to the open position such that the fluid in the second exhaust channel 172 may freely flow through the second port 191 and out of the second outlet 192 into the atmosphere. By allowing the fluid to freely flow through the second port 191 and out of the second outlet 192, the heat transfer at the socket 162 is increased because the fluid flows through the contacts 167 to the second exhaust channel 172 and out of the second outlet 192 without being restricted.

In some embodiments, the processor 116 operates the second exhaust valve 194 to the closed position such that the fluid in the second exhaust channel 172 is restricted from flowing through the second port 191 and out of the second outlet 192 into the atmosphere. By restricting the fluid to flow through the second port 191 and out of the second outlet 192, the heat transfer at the socket 162 is decreased (e.g., relative to when the flow of the fluid is not impeded by the second exhaust valve 194, etc.). Here, the fluid is restricted from flowing through the contacts 167 to the second exhaust channel 172 through the second port 191 and out of the second outlet 192, the fluid remains within the channel system 152, which decreases heat transfer.

In some embodiments, the processor 116 operates the second exhaust valve 194 to a semi-closed position such that flow of the fluid is partially restricted by the second exhaust valve 194. By partially restricting the flow of the fluid, the rate at which heat transfer between the fluid and the contacts 167 varies based on is the position of the second exhaust valve 194. For example, in some embodiments, when the processor 116 operates the second exhaust valve 194 to in the 20% closed position, the heat transfer between the fluid and the contacts 167 will be substantially greater than when the processor 116 operates the second exhaust valve 194 to be 80% closed.

In some embodiments, the processor 116 determines that the temperature of the contacts 167 of a first contactor assembly 138 is greater than the setpoint temperature or less than the setpoint temperature and operates the second exhaust valve 194 of a second contactor assembly 138 accordingly (e.g., based on a comparison between the temperature of the contacts 167 of the first contactor assembly 138 and the setpoint temperature, based on a comparison between the temperature of the contacts 167 of the first contactor assembly 138 and the setpoint temperature and based on a comparison between the temperature of the contacts 167 of the second contactor assembly 138 and the setpoint temperature etc.). For example, where the processor 116 determines that the temperature of the contacts 167 of the first contactor assembly 138 is substantially less than the setpoint temperature and the target device 101 is being tested at a high setpoint temperature, the processor 116 may reposition the second exhaust valve 194 to be opened so as to cause additional fluid to be provided to the contacts 167 of the second contactor assembly 138. In some embodiments, the second contactor assembly 138 does not include the contactor assembly sensor 168, and the second exhaust valve 194 of the second contactor assembly 138 is operated based on the temperature of the contacts 167 of the first contactor assembly 138.

In some embodiments, the second exhaust valve 194 is a bimorph valve. In these embodiments, the second exhaust valve 194 includes a valve member and includes a valve member connecting rod. The valve member is configured to regulate the flow of fluid through the second port 191. The valve member connecting rod is electrically connected to the contactor terminal 160 and is configured to cause the valve member to operatively change between an open, a closed, and a semi-closed position. The valve member connecting rod receives an electrical command transmitted from the processor 116 through the testing device terminal 131 and further through the contactor terminal 160. Upon receiving the electrical command, the valve member connecting rod causes the valve member to be repositioned. In operation, the fluid flows through the contacts 167 to the contactor assembly sensor 168. The contactor assembly sensor 168 is configured to facilitate a measurement of a property associated with the contacts 167 and the measurement is then transmitted to the contactor terminal 160. The second contactor assembly terminal transmits the measurement to the testing device terminal 131, which is then transmitted to the temperature controller 112. The processor 116 on the temperature controller 112 receives the measurement and stores the measurement in the memory 118. In some embodiments, the processor 116 may calculate the temperature of the contacts 167 from the measurement. In some embodiments, the measurement of the property received by the processor 116 is the temperature of the contacts 167. The processor 116 compares the temperature of the contacts 167 from the contactor assembly sensor 168 with the setpoint temperature stored on the memory 118. In some embodiments, the processor 116 may determine that the temperature of the contacts 167 is approximately equal to the setpoint temperature and the processor does not transmit a command to operate the valve member connecting rod. In some embodiments, the processor 116 may determine that the temperature of the contacts 167 is approximately equal to the setpoint temperature and the processor 116 transmits a command to operate the valve member connecting rod such that the valve member maintains the target position.

In some embodiments, the processor 116 transmits a command to the valve member connecting rod to operate the valve member to an open position such that the fluid in the second exhaust channel 172 may freely flow through the second port 191 and out of the second outlet 192 into the atmosphere. The valve member connecting rod receives a command from the processor 116 and transmits an electrical charge that causes the valve member to rotate about valve member connecting rod to an open position. By allowing the fluid to freely flow through the second port 191 and out of the second outlet 192, the heat transfer at the socket 162 is increased because the fluid flows through the contacts 167 to the second exhaust channel 172 and out of the second outlet 192 without being restricted.

In some embodiments, the processor 116 transmits a command to the valve member connecting rod to operate the valve member to a closed position such that the fluid in the second exhaust channel 172 is restricted from flowing through the second port 191 and out of the second outlet 192 into the atmosphere. The valve member connecting rod receives a command from the processor 116 and transmits an electrical charge that causes valve member to rotate about the connecting rod to a closed position such that the second port 191 and the second outlet 192 are no longer fluidly coupled. In some embodiments, the electrical charge transmitted by the valve member connecting rod to the valve member is a constant charge. By restricting the fluid to flow through the second port 191 and out of the second outlet 192, the heat transfer at the socket 162 is decreased (e.g., relative to when the flow of the fluid is not impeded by the valve member, etc.). The fluid is restricted from flowing through the connectors to the second exhaust channel 172 through the second port 191 and out of the second outlet 192 and remains within the channel system 152, which decreases heat transfer.

In some embodiments, the processor 116 transmits a command to the valve member connecting rod to operate the valve member to a semi-closed position such that flow of the fluid is partially restricted. The valve member connecting rod receives a command from the processor 116 and transmits an electrical charge that causes the valve member to partially rotate about the valve member connecting rod such that the second port 191 and the second outlet 192 are partially fluidly coupled. By partially restricting the flow of the fluid, the rate at which heat transfer between the fluid and the contacts 167 varies based on the rotation of the valve member about the valve member connecting rod. For example, in some embodiments, the electrical charge transmitted from the valve member connecting rod to the processor 116 causes the valve member to rotate such that 80% of the fluid flows through second port 191 and out of the second outlet 192. When 80% of the fluid flows through second port 191 and out of the second outlet 192, the heat transfer between the fluid and the contacts 167 will be greater than when 20% of the fluid flows through second port 191 and out of the second outlet 192. In some embodiments, the inlet valve 158 (as shown in FIG. 1) is configured as a bimorph valve and operatively works in a similar fashion as described above.

In some embodiments, the second exhaust valve 194 is a butterfly valve. In these embodiments, the contactor assembly 138 includes a second exhaust valve 194, which may be configured to be a butterfly valve. The butterfly valve includes a mounting body. The mounting body is configured to be disposed within the second port 191. The mounting body may be coupled (e.g., screwed, adhesively, interference fit, etc.), within the second port 191. The butterfly valve configuration of the second exhaust valve 194 also includes a butterfly valve member. The butterfly valve member is configured to regulate the flow of fluid through the second port 191. The butterfly valve member is coupled to a connecting rod. The connecting rod is coupled (e.g., hinge, pin assembly, etc.) to the mounting body and is configured to rotate the butterfly valve member about the connecting rod within the mounting body. The contactor assembly 138 also includes an electrical connect device 188 (e.g., actuator, etc.). The electrical connect device 188 is disposed near the second port 191 and is electrically connected to the contactor terminal 160. The electrical connect device 188 is configured to electrically operate the second exhaust valve 194. The electrical connect device 188 causes the butterfly valve member to rotate about the connecting rod within the mounting body and operatively change between an open, a closed, and a semi-closed position when the processor 116 transmits a command to the electrical connect device 188.

The electrical connect device 188 receives a command transmitted from the processor 116. The command is electrically transmitted through the testing device terminal 131 and further through the contactor terminal 160 to the electrical connect device 188. Upon receiving the electrical command from the processor 116, the electrical connect device 188 operatively rotates the connecting rod such that the butterfly valve member rotatably changes positions.

In operation (as shown in FIG. 1), the fluid flows through the contacts 167 to the contactor assembly sensor 168. The contactor assembly sensor 168 is configured to facilitate measurement of a property associated with the contacts 167 and the measurement is then transmitted to the contactor terminal 160. The second contactor assembly terminal transmits the measurement to the testing device terminal 131, which is then transmitted to the temperature controller 112. The processor 116 on the temperature controller 112 receives the measurement and stores the measurement in the memory 118. In some embodiments, the processor 116 may calculate the temperature of the contacts 167 from the measurement. In some embodiments, the measurement of the property received by the processor 116 is the temperature of the contacts 167. The processor 116 compares the temperature of the contacts 167 from the contactor assembly sensor 168 with the setpoint temperature stored on the memory 118. In some embodiments, the processor 116 may determine that the temperature of the contacts 167 is approximately equal to the setpoint temperature and the processor 116 does not transmit a command to the electrical connect device 188 to operate the connecting rod. In some embodiments, the processor 116 may determine that the temperature of the contacts 167 is approximately equal to the setpoint temperature and the processor 116 transmits a command to the electrical connect device 188 to maintain the butterfly valve member in the target position.

In some embodiments, the processor 116 transmits a command to the electrical connect device 188 to operate the connecting rod to an open position such that the fluid in the second exhaust channel 172 may freely flow through the second port 191 and out of the second outlet 192 into the atmosphere. The electrical connect device 188 receives a command from the processor 116 and operatively rotates the connecting rod such that the butterfly valve member is in an open position. When the butterfly valve member is in the open position, the fluid may flow freely within the second port 191 through the mounting body and out of the second outlet 192. In some embodiments, the butterfly valve member is considered in the open position when the butterfly valve member is perpendicular to the mounting body. By allowing the fluid to freely flow through the second port 191 and out of the second outlet 192, the heat transfer at the socket 162 is increased because the fluid flows through the contacts 167 to the second exhaust channel 172 and out of the second outlet 192 without being restricted.

In some embodiments, the processor 116 transmits a command to the electrical connect device 188 to operate the connecting rod to a closed position such that the fluid in the second exhaust channel 172 is restricted from flowing through the second port 191 and out of the second outlet 192 into the atmosphere. The electrical connect device 188 receives a command from the processor 116 and operatively rotates the connecting rod such that the butterfly valve member is in a closed position. When the connecting rod is in the closed position, the second port 191 and the second outlet 192 are no longer fluidly coupled. In some embodiments, the butterfly valve member is considered to be in a closed position when the butterfly valve member is parallel to the mounting body as shown in FIG. 8. By restricting the fluid to flow through the second port 191 and out of the second outlet 192, the heat transfer at the socket 162 is decreased (e.g., relative to when the flow of the fluid is not impeded by the butterfly valve member, etc.). The fluid is restricted from flowing through the connectors to the second exhaust channel 172 through the second port 191 and out of the second outlet 192 and remains within the channel system 152, which decreases heat transfer.

In some embodiments, the processor 116 transmits a command to the electrical connect device 188 to operate the connecting rod such that the butterfly valve member is in a semi-closed position. When the butterfly valve member is in a semi-closed position, that flow of the fluid is partially restricted. The electrical connect device 188 receives a command from the processor 116 and operatively rotates the connecting rod such that the butterfly valve member is partially rotated. When the butterfly valve member is partially rotated, the second port 191 and the second outlet 192 are partially fluidly coupled. In some embodiments, the butterfly valve member is considered partially rotated when the butterfly valve member is offset by an angle (e.g., 20°, 25°, 30°, 40°, 45°, 50°, 60°, 70°, 75°, 80°, etc.) with respect to the mounting body. By partially restricting the flow of the fluid, the rate at which heat transfer between the fluid and the contacts 167 varies based on the rotation of the butterfly valve member with respect to the mounting body. For example, in some embodiments, the electrical connect device 188 operatively rotates the connecting rod such that the butterfly valve member is rotated to allow 80% of the fluid flows through second port 191 and out of the second outlet 192. When 80% of the fluid flows through second port 191 and out of the second outlet 192, the heat transfer between the fluid and the contacts 167 will be greater than when 20% of the fluid flows through second port 191 and out of the second outlet 192. In some embodiments, the inlet valve 158 (as shown in FIG. 1) is configured as a butterfly valve and operatively works in a similar fashion as described above.

In some embodiments, the second exhaust valve 194 is a rotatable insert. For example, the temperature controller 112 may provide the temperature of at the contacts 167 and the setpoint temperature to the user via a display, and the user may manually adjust the second exhaust valve 194 (e.g., using a tool, etc.), so as to cause the temperature of the contacts 167 to reach the setpoint temperature.

In one embodiment, the rotatable insert is configured to enable a user to manually adjust and control the heating or cooling provided to the contacts 167 from the fluid such that the contacts 167 reach a setpoint temperature. In operation, the fluid flows through the contacts 167 to the contactor assembly sensor 168. The contactor assembly sensor 168 is configured to facilitate measurement of a physical property associated with the contacts 167 and the measurement is then transmitted to the contactor terminal 160. The second contactor assembly terminal transmits the measurement to the testing device terminal 131, which is then transmitted to the temperature controller 112. The temperature controller 112 receives the measurement and in some embodiments, displays the measurement to a user. The user then adjusts the rotatable insert. In some embodiments, the user adjusts the rotatable insert such that the rotatable insert fully extends into the second exhaust channel 172 based on the measurement displayed by the temperature controller 112. Here, the second exhaust valve 194 is in a closed position as to inhibit the flow of the fluid from the second exhaust channel 172 to the second port 191. This allows for the heating or cooling provided to the contacts 167 from the fluid to be decreased. In some embodiments, the user adjusts the rotatable insert such that a portion of the rotatable insert extends into the second exhaust channel 172 based on the measurement displayed by the temperature controller 112. Here, the second exhaust valve 194 is in a semi-closed position as to restrict the flow of the fluid from the second exhaust channel 172 to the second port 191. In some embodiments, the user adjusts the rotatable insert such that the rotatable insert is disposed entirely within the second port 191 and no portion of the rotatable insert extends into the second exhaust channel 172. Here, the second exhaust valve 194 is in an open position as to allow the fluid to flow from the second exhaust channel 172 through the second port channel and out of to the second port 191. This enables the heating provided to the contacts 167 from the fluid to be increased.

Figure 9:
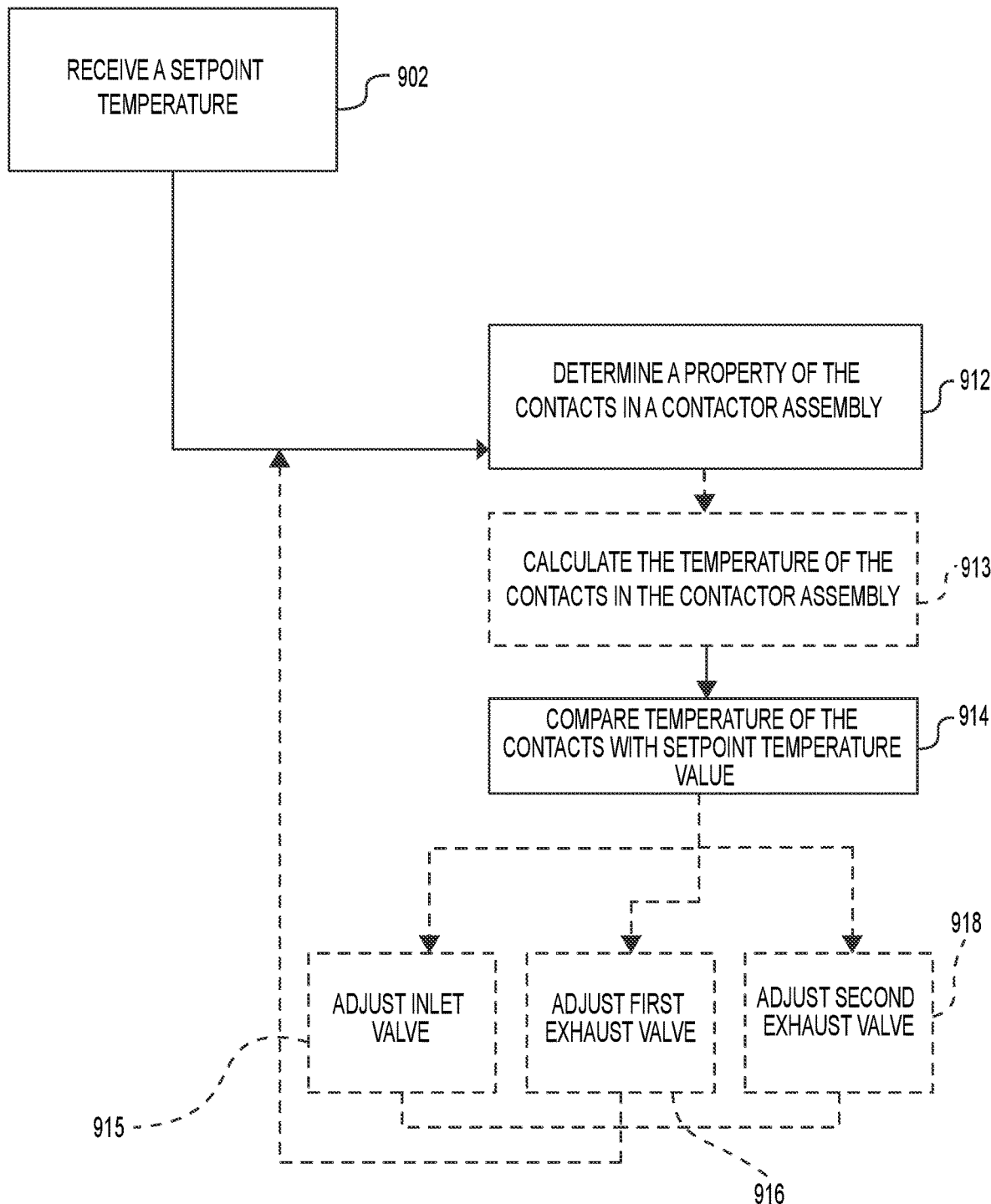
FIG. 9 illustrates a process for operating the temperature control system.

FIG. 9 illustrates a process 900 for operating the temperature control system 100 to control the temperature of the contacts 167. The process 900 is a closed loop process that compares the setpoint temperature to a temperature of the contacts 167 included in at least one contactor assembly coupled to a testing device 130, as described herein. In contrast to this closed loop process, many contactors lack the ability to control inlet valves or exhaust valves located within the contactor assemblies automatically through a feedback loop.

The process 900 includes, in block 902, receiving, by the temperature controller 112 a setpoint temperature. For example, the setpoint temperature may be received from a user or may be retrieved from the memory 118 by the processor 116 of for a target device. The setpoint temperature is the temperature at which it is desired to test operation of a target device.

The process 900 has the fluid source 102 provide the heat exchanger 120 a fluid. In some embodiments, the fluid is compressed dry air. In some embodiments, the process 900 includes a fluid pump. The process 900, operates, by the temperature controller 112, the heat exchanger 120. The heat exchanger 120 is operated to alter (e.g. increase, decrease) the temperature of the fluid received by the heat exchanger 120 from the fluid source. The temperature controller 112 provides the heat exchanger 120 with a setpoint temperature and operates the heat exchanger 120 to cause the temperature of the fluid to attain the setpoint temperature. In some embodiments, the heat exchanger 120 is operated to cool the fluid received by utilizing a cooling device 124 (e.g., liquid nitrogen supply, cooling coil, fan, Peltier cell, etc.). In some embodiments, the cooling device 124 supplies liquid nitrogen to the fluid to cool the fluid. In some embodiments, the heat exchanger 120 is operated to heat the fluid utilizing the heating device 126.

The process 900, in block 912, determines by the temperature controller 112, a reading of a property of associated with the contacts 167 (e.g., a temperature of the contacts, etc.) within a contactor assembly 138. A contactor assembly sensor 168 located within the contactor assembly 138 is configured to facilitate measurement of a property associated with the contacts 167 by providing a signal to the temperature controller 112. The temperature controller 112 receives the signal and determines a reading of the property. In some embodiments, the reading determined by the temperature controller 112 is a temperature of the contacts 167. In some embodiments, the reading determined by the temperature controller 112 is a temperature of the fluid flowing through the contacts 167 and around the contactor assembly sensor 168.

In some embodiments, when the reading determined by the temperature controller 112 is not a temperature of the contacts 167 (e.g., the reading is a pressure, the reading is a viscosity, etc.), the process 900, in block 913, determines, by the temperature controller 112, the temperature of the contacts 167 using the reading. For example, the temperature controller 112 may calculate the temperature of the contacts 167 using the reading and a calculation that converts the reading to the temperature.

Further, in block 914, once the temperature controller 112 determines the temperature of the contacts 167, the temperature controller 112 compares the temperature of the contacts 167 with the setpoint temperature.

The process 900, in block 915, may operate the inlet valve 158 using the temperature controller 112. For example, in block 914, the temperature controller 112 may determine that the temperature of the contacts 167 is greater than the setpoint temperature or less than the setpoint temperature, then in block 915, the temperature controller 112 may operate the inlet valve 158 to an open position such that the fluid flow is not impeded by the inlet valve 158. The temperature controller 112 may operate the inlet valve 158 to a closed position, or a semi-closed position to regulate a flow of fluid in a contactor assembly. In the closed position, the flow of the fluid is inhibited such that none of the fluid flows to the contacts 167. In the semi-closed position, the flow of the fluid is impeded by the inlet valve 158 at the inlet channel 154 such that only a portion of the fluid flows to the contacts 167 via the first body channel 156. By impeding the flow of the fluid using the inlet valve 158, the heating or cooling provided from the fluid to the contacts 167 is decreased (e.g., relative to when the flow of the fluid is not impeded by the inlet valve 158, etc.).

The process 900, in block 916, may operate by the temperature controller 112, a first exhaust valve 176. For example, in block 914, the temperature controller 112 may determine that the temperature of the contacts 167 is less than the setpoint temperature, then in block 916, the temperature controller 112 may operate the first exhaust valve 176 to an open position such that the fluid flow is not impeded by the first exhaust valve 176 (e.g., where the setpoint temperature is relatively high). In this way, the fluid flows through the contacts 167 and provides more heating to the contacts 167 than when the first exhaust valve 176 is not in the open position.

In some embodiments of block 916, the first exhaust valve 176 is operated to a closed position, or a semi-closed position to regulate a flow of fluid in a contactor assembly. In the closed position, the flow of the fluid is inhibited such that none of the fluid flows through the first outlet 175. In the semi-closed position, the flow of the fluid is impeded by the first exhaust valve 176 such that only a portion of the fluid flows through the first outlet 175. By impeding the flow of the fluid using the first exhaust valve 176, the heating or cooling provided from the fluid to the contacts 167 is decreased (e.g., relative to when the flow of the fluid is not impeded by the first exhaust valve 176, etc.).

The process 900, in block 918, may operate by the temperature controller 112, a second exhaust valve 194. For example, in block 914, the temperature controller may determine that the temperature of the contacts 167 is less than the setpoint temperature and the target device 101 is being tested at a high setpoint temperature, then in block 914, the temperature controller 112 may operate the temperature controller 112 may operate the second exhaust valve 194 to an open position such that the fluid flow is not impeded by the second exhaust valve 194 (e.g., where the setpoint temperature is relatively high). In this way, the fluid flows through the contacts 167 and provides more heating or cooling to the contacts 167 than when the second exhaust valve 194 is not in the open position.

In some embodiments of block 918, the second exhaust valve 194 is operated to a closed position, or a semi-closed position to regulate a flow of fluid in a contactor assembly. In the closed position, the flow of the fluid is inhibited such that none of the fluid flows through the second outlet 192. In the semi-closed position, the flow of the fluid is impeded by the second exhaust valve 194 such that only a portion of the fluid flows through the second outlet 192. By impeding the flow of the fluid using the second exhaust valve 194, the heating or cooling provided from the fluid to the contacts 167 is decreased (e.g., relative to when the flow of the fluid is not impeded by the second exhaust valve 194, etc.).

In some embodiments, the process 900 may include both blocks 916 and 918 in a single process. The process 900 may operate a first exhaust valve 176 and a second exhaust valve 194 to an open position, a closed position, or a semi-closed position to regulate the flow of a fluid in a contactor assembly. In some embodiments, the process 900 may first operate the first exhaust valve 176 and independently operate the second exhaust valve 194.

The process 900 may return to block 912. Once the process 900, in blocks 915, 916, or 918, operates at least one of the inlet valve 158, the first exhaust valve 176, or the second exhaust valve 194, the process 900 may repeat block 912. In process 900, at least one of the inlet valve 158, the first exhaust valve 176, or the second exhaust valve 194 is operated by the temperature controller 112. Then the process 900 returns in block 912, and determines the property of the fluid by the temperature controller 112 following operatively adjusting at least one of the inlet valve 158, the first exhaust valve 176, or the second exhaust valve 194. In some embodiments, the process 900 occurs for as long as the target device is being tested on the testing device 130.

In some embodiments, the process 900, determines by the temperature controller 112 a plurality of readings of a property of the contacts 167 within a plurality of contactor assemblies 138 (e.g., contacts 167 of a first contactor assembly 138, contacts 167 of a second contactor assembly 138, etc.). A contactor assembly sensor 168 located within each of the contactor assemblies 138 is configured to facilitate independent measurements of property of the contacts 167. In some embodiments, the contactor assemblies 138 is configured to facilitate independent measurements of the fluid when the fluid flows around each of the contactor assembly sensors 168. As a result, the process 900 determines a temperature of the contacts within a first contactor assembly 138 and a temperature of the contacts within a second contactor assembly 138. In these embodiments, control of the at least one of the inlet valve 158, the first exhaust valve 176, or the second exhaust valve 194 in the first contactor assembly 138 may be based on the temperature within at least one of the first contactor assembly 138 or the second contactor assembly 138.

Additionally, control of the at least one of the inlet valve 158, the first exhaust valve 176, or the second exhaust valve 194 in the second contactor assembly 138 may be based on the temperature within at least one of the first contactor assembly 138 or the second contactor assembly 138, in various embodiments. In this way, the process 900 may be implemented with any number of contactor assemblies 138. For example, where the temperature control system 100 includes thirty-two contactor assemblies 138, an adjustment to one valve (e.g., the inlet valve 158, the first exhaust valve 176, the second exhaust valve 194) in the first contactor assembly 138 will impact flow of the fluid to the remaining thirty-one contactor assemblies 138. Depending on geometry and the time constant, control of the temperature at one contactor assemblies 138 may be performed independent of control of the other contactor assemblies 138. However, where the time constant is small, control of the temperature of each contactor assembly 138 may take into account temperature of the other contactor assemblies 138.

In some embodiments, the process 900, compares by the temperature controller 112, the temperatures of the contacts within each of the contactor assemblies 138 to the setpoint temperature. The process 900 may reposition by the temperature controller 112, at least one of the inlet valve 158, the first exhaust valve 176, or the second exhaust valve 194 of each of the contactor assemblies 138 such that temperature of the contacts 167 within each of the contactor assemblies 138 is approximately equal to the setpoint temperature.

In some embodiments, the testing device 101 includes a testing device sensor 1000, as shown in FIG. 2. The testing device sensor 1000 is configured to facilitate measurement of a property of the contacts 167. In some embodiments, the measurement of the property may be the temperature of the contacts 167. The measurement is then transmitted to the temperature controller 112 and the processor 116 may facilitate operation of the inlet valve 158 of the first contactor assembly 138, the first exhaust valve 174 of the first contactor assembly 138, and the second exhaust valve 194 of the first contactor assembly 138 based on the measurement as described herein. In some embodiments, the measurement may cause the processor 116 to facilitate operation of the inlet valve 158 of the second contactor assembly 138, the first exhaust valve 174 of the second contactor assembly 138, and the second exhaust valve 194 of the second contactor assembly 138 based on the measurement as described herein. The testing device sensor 1000 may be a base emitter junction (e.g., diode, etc.).

While this specification contains many specific implementation details, these should not be construed as limitations on the scope of what may be claimed but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described as acting in certain combinations and even initially claimed as such, one or more features from a claimed combination can, in some cases, be excised from the combination, and the claimed combination may be directed to a subcombination or variation of a subcombination.

As utilized herein, the terms "substantially," "generally," "approximately," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the appended claims.

The term "coupled" and the like, as used herein, mean the joining of two components directly or indirectly to one another. Such joining may be stationary (e.g., permanent) or moveable (e.g., removable, releasable, or rotatable). Such joining may be achieved with the two components or the two components and any additional intermediate components being integrally formed as a single unitary body with one another, with the two components, or with the two components and any additional intermediate components being attached to one another.

The terms "fluidly coupled to" and the like, as used herein, mean the two components or objects have a pathway formed between the two components or objects in which a fluid, such as air, compressed dry air, compressed air, etc., may flow, either with or without intervening components or objects. Examples of fluid couplings or configurations for enabling fluid communication may include piping, channels, or any other suitable components for enabling the flow of a fluid from one component or object to another.

It is important to note that the construction and arrangement of the various systems shown in the various example implementations is illustrative only and not restrictive in character. All changes and modifications that come within the spirit or scope of the described implementations are desired to be protected. It should be understood that some features may not be necessary, and implementations lacking the various features may be contemplated as within the scope of the disclosure, the scope being defined by the claims that follow. When the language "a portion" is used, the item can include a portion or the entire item unless specifically stated to the contrary.

Also, the term "or" is used, in the context of a list of elements, in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

Additionally, the use of ranges of values (e.g., W1 to W2, etc.) herein are inclusive of their maximum values and minimum values (e.g., W1 to W2 includes W1 and includes W2, etc.), unless otherwise indicated. Furthermore, a range of values (e.g., W1 to W2, etc.) does not necessarily require the inclusion of intermediate values within the range of values (e.g., W1 to W2 can include only W1 and W2, etc.), unless otherwise indicated.

What is claimed is:

1. A method for controlling temperature in a temperature control system, the method comprising;
   providing a temperature control system including a controller, a first contactor assembly having a first channel system, a plurality of first contacts, each of the first contacts including a portion that is disposed within the first channel system, and one or more of a first exhaust valve or a first inlet valve, and a second contactor assembly having a second channel system, a plurality of second contacts, each of the second contacts including a portion that is disposed within the second channel system, and one or more of a second exhaust valve or a second inlet valve;
   receiving, by the first contactor assembly, a fluid at a first temperature;
   receiving, by the second contactor assembly, the fluid at the first temperature;
   determining, by the controller, a temperature of the first contacts within the first channel system;
   comparing, by the controller, the temperature of the first contacts to a setpoint temperature; and
   causing, by the controller, the one or more of the first exhaust valve or the first inlet valve to be repositioned based on the comparison of the temperature of the first contacts to the setpoint temperature.

2. The method for controlling temperature in a temperature control system of claim 1, further comprising receiving, by the controller, a first signal; wherein providing the temperature control system further comprises providing a first contactor assembly sensor disposed within the first channel system configured to provide the first signal to the controller; and wherein determining the temperature of the first contacts is based on the first signal.

3. The method for controlling temperature in a temperature control system of claim 2, further comprising: determining, by the controller, a temperature of the second contacts within the second channel system; comparing, by the controller, the temperature of the second contacts to the setpoint temperature; and causing, by the controller, the one or more of the second exhaust valve or the second inlet valve to be repositioned based on the comparison of the temperature of the second contacts to the setpoint temperature.

4. The method for controlling temperature in a temperature control system of claim 3, further comprising causing, by the controller, the one or more of the first exhaust valve or the first inlet valve to be repositioned based on the comparison of the temperature of the second contacts to the setpoint temperature.

5. The method for controlling temperature in a temperature control system of claim 4, further comprising receiving, by the controller, a second signal; wherein providing the temperature control system further comprises providing a second contactor assembly sensor disposed within the second channel system configured to provide the second signal to the controller; and wherein determining the temperature of the second contacts is based on the second signal.

6. The method for controlling temperature in a temperature control system of claim 1, wherein providing the temperature control system further comprises providing a plurality of additional contactor assemblies, each of the additional contactor assemblies comprising an additional channel system a plurality of additional contacts, each of the additional contacts including a portion that is disposed within the additional channel system, and one or more of an additional exhaust valve or an additional inlet valve.

7. The method for controlling temperature in a temperature control system of claim 1, further comprising: causing, by the controller, one or more of a third exhaust valve or a third inlet valve to be repositioned based on the comparison of the temperature of the first contacts to the setpoint temperature; and causing, by the controller, one or more of a fourth exhaust valve or a fourth inlet valve to be repositioned based on the comparison of the temperature of the first contacts to the setpoint temperature; wherein providing the temperature control system further comprises providing a third contactor assembly having a third channel system, a plurality of third contacts, each of the third contacts including a portion that is disposed within the third channel system, and one or more of the third exhaust valve or the third inlet valve, and a fourth contactor assembly having a fourth channel system, a plurality of fourth contacts, each of the fourth contacts including a portion that is disposed within the fourth channel system, and one or more of the fourth exhaust valve or the fourth inlet valve.

8. The method for controlling temperature in a temperature control system of claim 1, further comprising causing, by the controller, the one or more of the second exhaust valve or the second inlet valve to be repositioned based on the comparison of the temperature of the first contacts to the setpoint temperature.

9. A temperature control system comprising:
a testing device comprising a plurality of contactor receiving locations;
a sensor configured to provide a signal;
a contactor assembly positioned within one of the contactor receiving locations, the contactor assembly comprising:
a channel system configured to receive a fluid,
a plurality of contacts, each of the contacts including a portion that is disposed within the channel system,
a first port configured to provide the fluid from the contactor assembly, and
at least one of:
a first exhaust valve in fluid communication with the first port, the first exhaust valve operable between an open position and a closed position, the first exhaust valve facilitating flow from the contactor assembly in the open position and inhibiting flow from the contactor assembly in the closed position, or
an inlet valve operable between an open position and a closed position, the inlet valve facilitating flow to the sensor in the open position and inhibiting flow to the sensor in the closed position; and
a controller configured to:
receive a setpoint temperature associated with testing of a target device,
determine a temperature of the contacts based on the signal,
compare the temperature to the setpoint temperature, and
reposition the at least one of the first exhaust valve or the inlet valve, towards one of the open position or the closed position based on the comparison between the temperature and the setpoint temperature.

10. The temperature control system of claim 9, wherein, when the at least one of the first exhaust valve or the inlet valve is the first exhaust valve, the controller is configured to cause the first exhaust valve to be repositioned towards the open position when the temperature is less than the setpoint temperature.

11. The temperature control system of claim 10, wherein, when the at least one of the first exhaust valve or the inlet valve is the first exhaust valve, the controller is configured to cause the first exhaust valve to repositioned towards the closed position when the temperature is greater than the setpoint temperature.

12. The temperature control system of claim 9, wherein, when the at least one of the first exhaust valve or the inlet valve is the first exhaust valve, the controller is configured to cause the first exhaust valve to be repositioned towards the open position when the temperature is greater than the setpoint temperature.

13. The temperature control system of claim 12, wherein, when the at least one of the first exhaust valve or the inlet valve is the first exhaust valve, the controller is configured to cause the first exhaust valve to repositioned towards the closed position when the temperature is less than the setpoint temperature.

14. The temperature control system of claim 9, wherein, when the at least one of the first exhaust valve or the inlet valve is the inlet valve, the controller is configured to cause the inlet valve to be repositioned towards the open position when the temperature is less than the setpoint temperature.

15. The temperature control system of claim 14, wherein, when the at least one of the first exhaust valve or the inlet valve is the inlet valve, the controller is configured to cause the inlet valve to repositioned towards the closed position when the temperature is greater than the setpoint temperature.

16. The temperature control system of claim 9, wherein, when the at least one of the first exhaust valve or the inlet valve is the inlet valve, the controller is configured to cause the inlet valve to be repositioned towards the closed position when the temperature is less than the setpoint temperature.

17. The temperature control system of claim 9, wherein, when the at least one of the first exhaust valve or the inlet valve is the first exhaust valve:
the contactor assembly further comprises:
a second port configured to provide the fluid from the contactor assembly; and
a second exhaust valve positioned within the second port, the second exhaust valve operable between an open position and a closed position, the second exhaust valve facilitating flow of the fluid from the contactor assembly in the open position and inhibiting flow from the contactor assembly in the closed position; and the controller is configured to cause the second exhaust valve to be repositioned towards one of the open position or the closed position, based on the comparison between the temperature and the setpoint temperature.

18. The temperature control system of claim 9, wherein the sensor is disposed within the channel system.

19. The temperature control system of claim 9, wherein the valve is a bimorph valve or a butterfly valve.

20. The temperature control system of claim 9, wherein the sensor is a resistance temperature device or a thermocouple.

21. The temperature control system of claim 9, wherein the sensor is a resistance temperature device or a thermocouple.

22. The temperature control system of claim 9, wherein the sensor is included in the testing device.

* * * * *